(12) United States Patent
Stowers et al.

(10) Patent No.: US 11,971,430 B2
(45) Date of Patent: Apr. 30, 2024

(54) MASS-INTERCONNECT ENGAGING DEVICE

(71) Applicant: Leyo, LLC, Verona, VA (US)

(72) Inventors: Jeffery P. Stowers, Mt. Sidney, VA (US); Benjamin T. Ailinger, Harrisonburg, VA (US)

( * ) Notice: Subject to any disclaimer, the term of this patent is extended or adjusted under 35 U.S.C. 154(b) by 0 days.

(21) Appl. No.: 18/281,294

(22) PCT Filed: May 5, 2023

(86) PCT No.: PCT/US2023/021115
§ 371 (c)(1),
(2) Date: Nov. 16, 2023

(87) PCT Pub. No.: WO2023/219883
PCT Pub. Date: Nov. 16, 2023

(65) Prior Publication Data
US 2024/0077517 A1    Mar. 7, 2024

Related U.S. Application Data

(60) Provisional application No. 63/340,071, filed on May 10, 2022.

(51) Int. Cl.
| | | |
|---|---|---|
| G01R 1/02 | (2006.01) | |
| G01R 1/04 | (2006.01) | |
| G01R 1/067 | (2006.01) | |
| G01R 1/073 | (2006.01) | |
| G01R 31/28 | (2006.01) | |
| H01R 13/62 | (2006.01) | |

(52) U.S. Cl.
CPC ....... *G01R 1/0416* (2013.01); *G01R 31/2834* (2013.01)

(58) Field of Classification Search
CPC .......... G01R 1/02; G01R 1/04; G01R 1/0416; G01R 1/067; G01R 1/073; G01R 31/28; G01R 31/2834; H01R 13/62; H01R 13/625
See application file for complete search history.

(56) References Cited

U.S. PATENT DOCUMENTS

| | | | |
|---|---|---|---|
| 4,329,005 A * | 5/1982 | Braginetz | G01R 1/04 439/51 |
| 4,984,383 A | 1/1991 | Mummey et al. | |
| 5,320,544 A | 6/1994 | Naoto et al. | |
| 6,227,888 B1 * | 5/2001 | Hahn | H01R 27/00 439/172 |
| 7,267,563 B2 | 9/2007 | Stowers et al. | |

* cited by examiner

*Primary Examiner* — Neel D Shah
(74) *Attorney, Agent, or Firm* — Benjamin C. Rothermel, Esq.

(57) ABSTRACT

An engaging device in a Mass-Interconnect, which provides an apparatus and method to change test adapters for testing applications. An engaging device of a Mass-Interconnect includes an interchangeable test adapter (ITA) and a locking mechanism. The locking mechanism includes a plunger having a plunger head at a first end thereof, a leaflet insert disposed over the plunger, a sleeve disposed over the leaflet insert, an over-dead-center (ODC) link connected to the plunger at a second end thereof opposite to the first end, and a rotatable handle connected to the ODC link. The plunger, the leaflet insert, and the sleeve of the locking mechanism engage or disengage the ITA when a user rotates the rotatable handle.

16 Claims, 22 Drawing Sheets

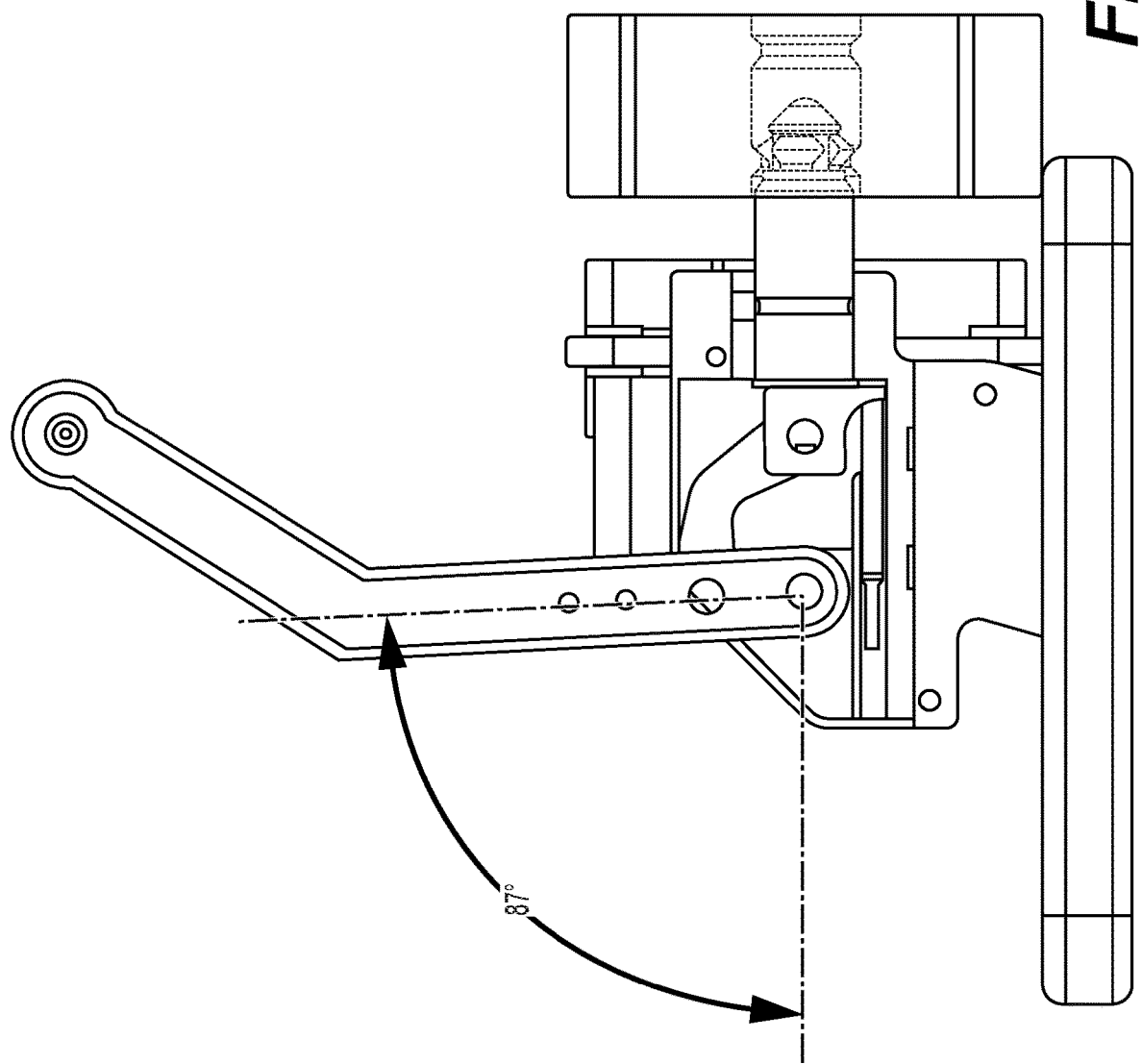

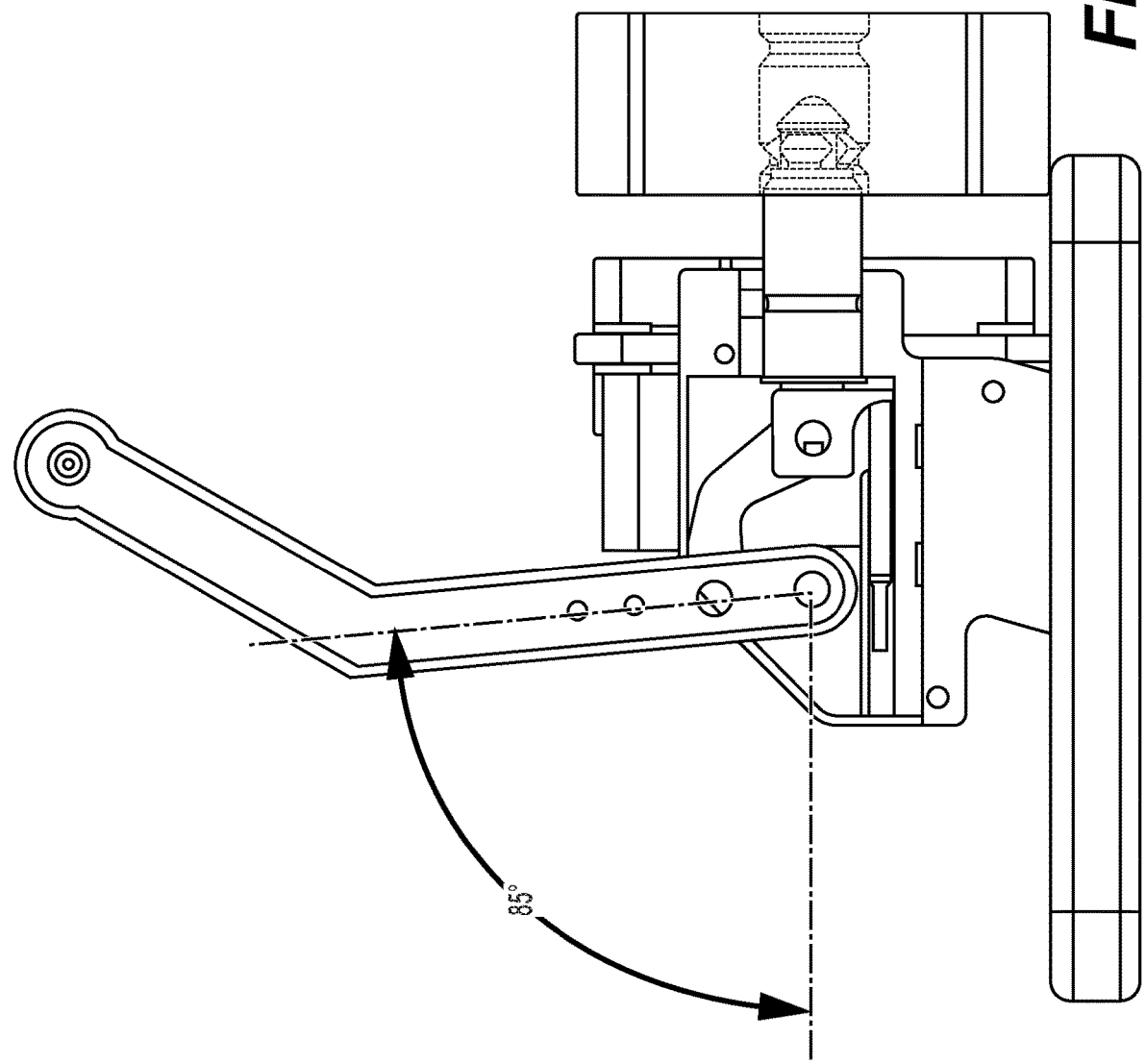

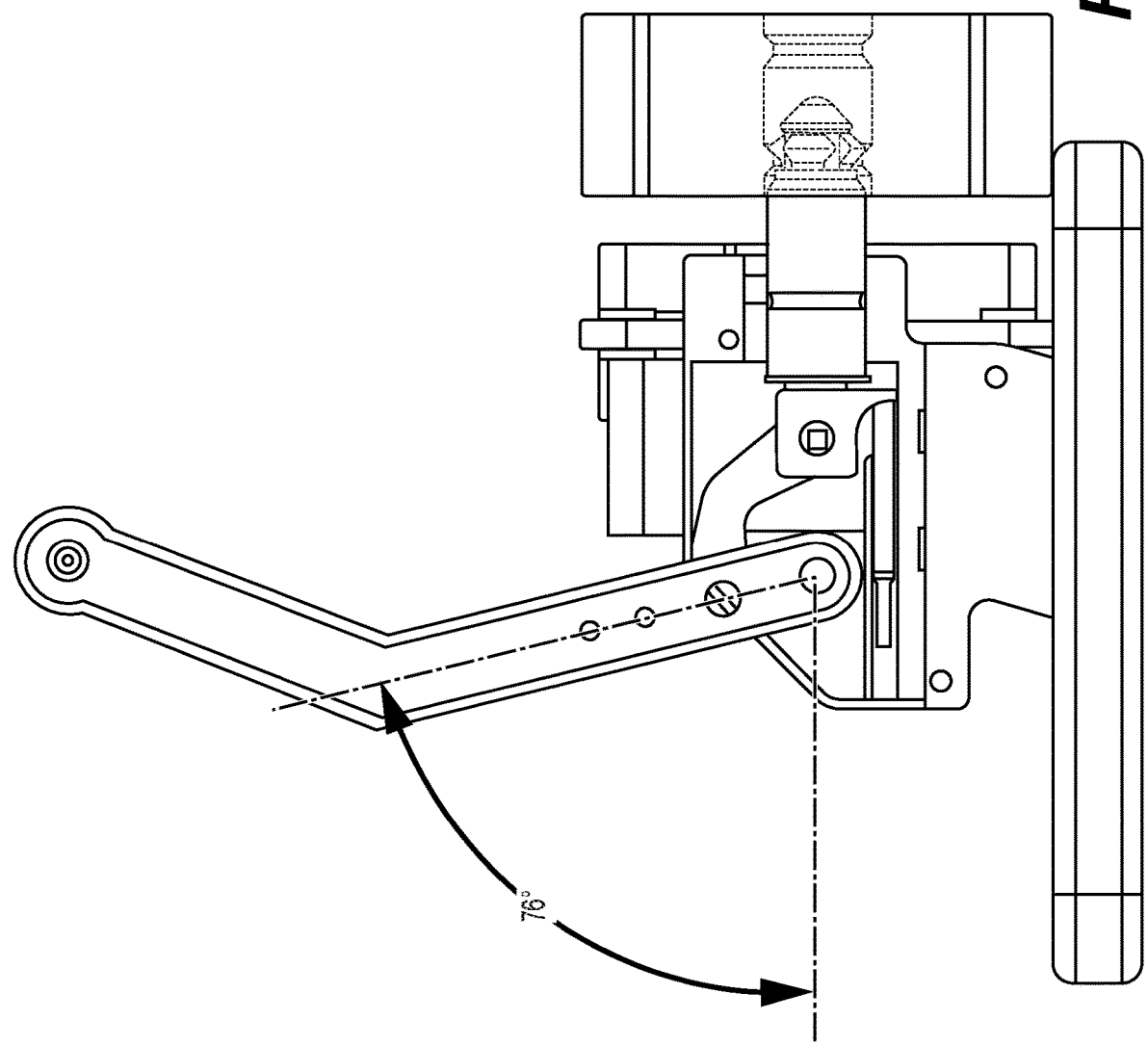

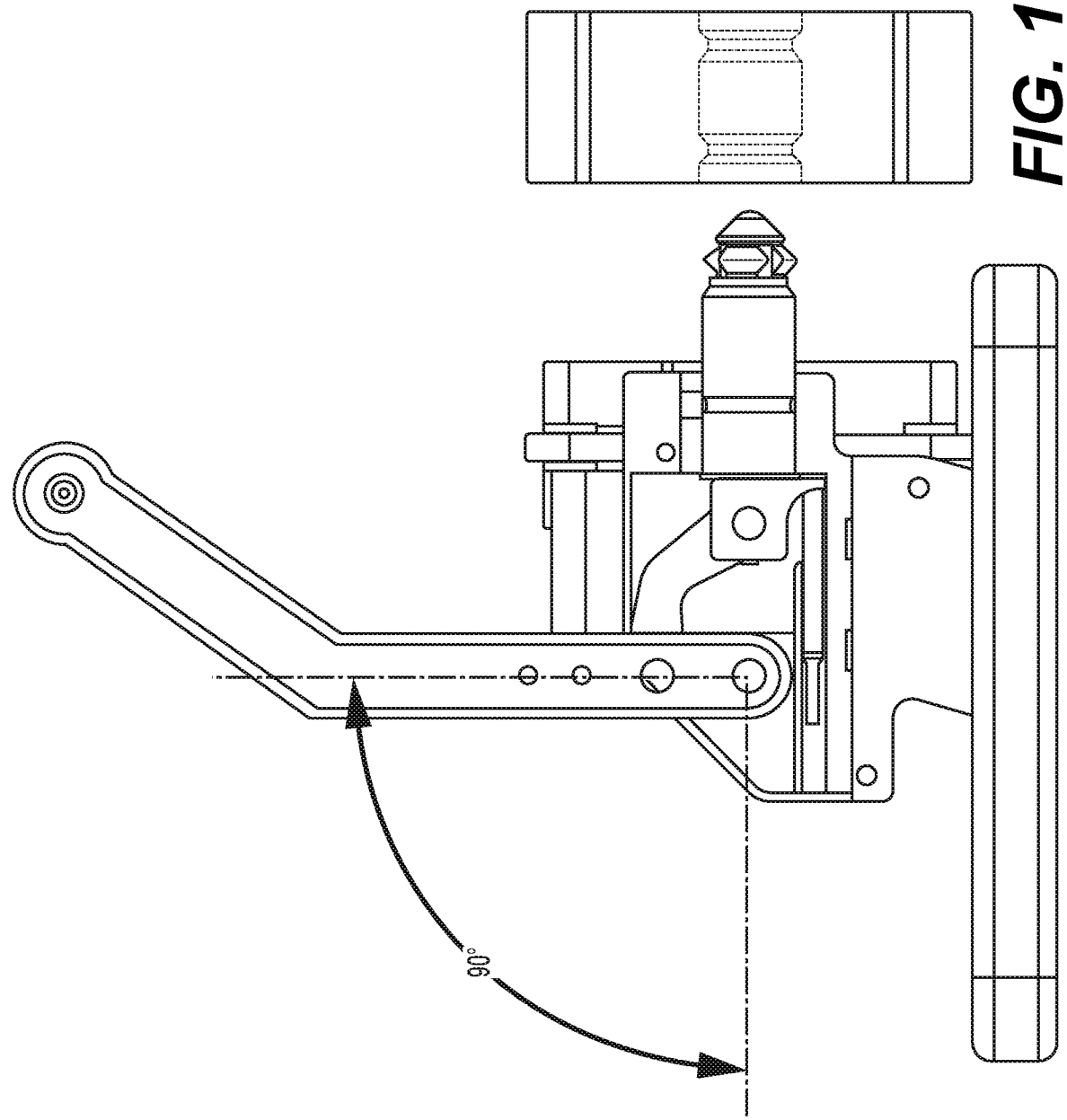

MASS-INTERCONNECT ENGAGING DEVICE

CROSS-REFERENCE TO RELATED APPLICATIONS

The present application is the National Stage of International Application No. PCT/US2023/021115, filed on May 5, 2023, and claims priority from and the benefit of U.S. Provisional Patent Application No. 63/340,071, filed on May 10, 2022, which are both hereby incorporated by reference for all purposes as if fully set forth herein.

BACKGROUND

Field

Exemplary embodiments relate to an engaging device to be used in a Mass-Interconnect. In particular, exemplary embodiments relate to an engaging device that provides a simplified method of connecting test adapter interconnect panels to a device under test (DUT).

Discussion of the Background

Automatic Test Equipment (ATE) is used to verify the design and functionality of electronic devices. The ATE may include electronic instruments that are connected to a DUT, and use various interconnects between it and the DUT. A test adapter provides a direct connection to the DUT. Test adapters may be wired directly to the measurement instruments or connected to an intermediate connector. The intermediate connector may be individual or grouped in mass with an electro-mechanical device to engage the various connectors. This type of intermediate device is commonly referred to as a Mass-Interconnect. Mass-Interconnects provide a quick method to change test adapters for other testing applications. Mass-Interconnects come in various sizes and configurations depending on the DUT requirements.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an engaging device for a Mass-Interconnect system, which simplifies the process of connecting and disconnecting an interchangeable test adapter (ITA) to facilitate efficient and reliable testing of electronic devices. The engaging device comprises an ITA and a locking mechanism, which together ensure secure connections and ease of use. Interconnect panels are separate from the engaging device itself, which allows flexibility in using different interconnect panels with the same ATE system.

Exemplary embodiments provide an engaging device of a Mass-Interconnect, the engaging device including an interchangeable test adapter (ITA) and a locking mechanism, the locking mechanism including a plunger with a plunger head at a first end thereof, a leaflet insert disposed over the plunger, a sleeve disposed over the leaflet insert, an over-dead-center (ODC) link connected to the plunger at a second end thereof, and a rotatable handle connected to the ODC link. The plunger, leaflet insert, and sleeve of the locking mechanism may engage or disengage from the ITA when a user rotates the rotatable handle.

Exemplary embodiments also provide a locking mechanism for engaging and disengaging an Interchangeable Tool Assembly (ITA). The locking mechanism includes a plunger having a plunger head positioned at a distal end thereof, and a plurality of leaflets each having a locking tab at a tip thereof, the plurality of leaflets disposed over the plunger. The locking tabs each have a 45° angled surface, and the plunger head has an inner surface having a complimentary 45° angle that fills a space between the locking tabs at the 45° angled surface thereof.

Exemplary embodiments also provide a method of engaging an engaging device, the engaging device including an interchangeable test adapter (ITA) including a locking bushing, and a locking mechanism, the locking mechanism including a plunger with a plunger head at a first end thereof, a leaflet insert including locking tabs, the leaflet disposed over the plunger, a sleeve disposed over the leaflet insert, an over-dead-center (ODC) link connected to the plunger at a second end thereof, and a handle connected to the ODC link. The method includes rotating the handle 90° by a user from an unlocked position to a locked ODC position, wherein the locking mechanism is locked with the ITA during a full 90° rotation of the handle.

The engaging device allows for rapid and secure engagement and disengagement of the ITA, significantly reducing setup time and ensuring a reliable connection during testing. The interchangeable nature of the ITA enables compatibility with various testing configurations and electronic devices, making the engaging device a versatile and essential tool for efficient and accurate testing.

Additional aspects will be set forth in the detailed description which follows, and, in part, will be apparent from the disclosure, or may be learned by practice of the inventive concept.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 13, FIG. 14A, FIG. 14B, FIG. 15A, FIG. 15B, FIG. 16, FIG. 17A, FIG. 17B, FIG. 18, and FIG. 19 are views illustrating an engagement/disengagement process of an engaging device according to an exemplary embodiment.

DETAILED DESCRIPTION

Figure 1:
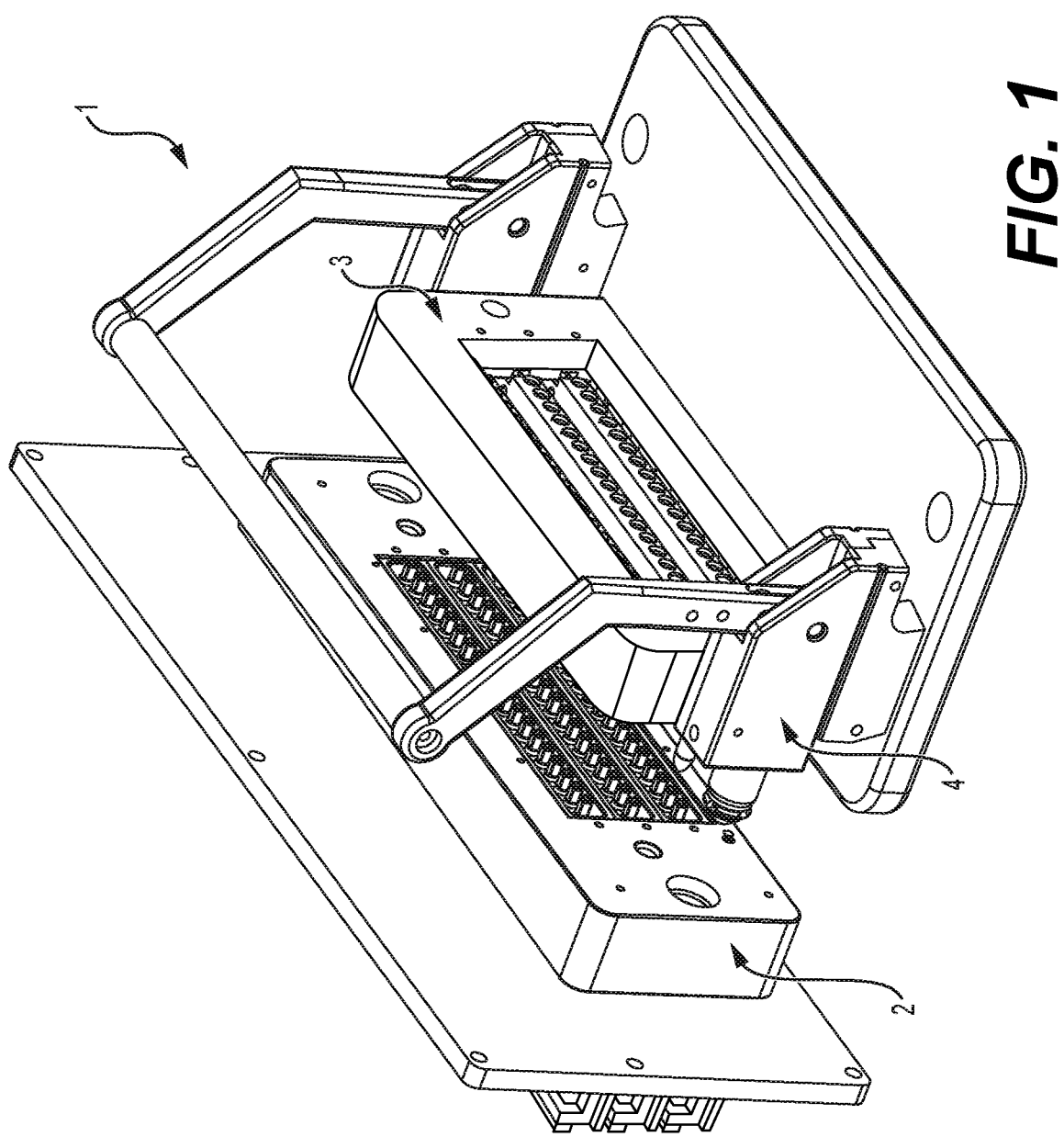
FIG. 1 is a perspective view of an engaging device including a locking mechanism according to an exemplary embodiment.
Figure 2:
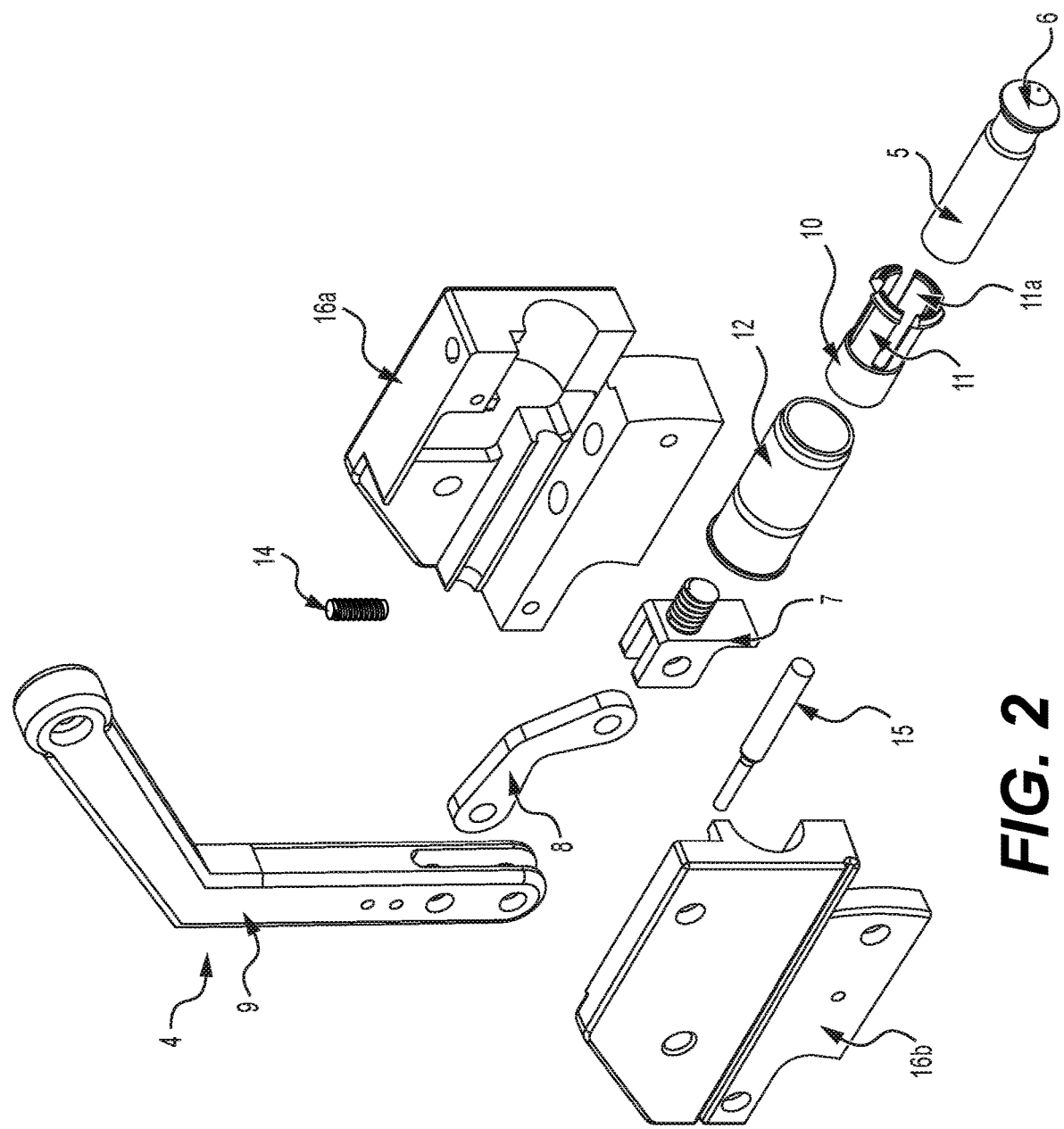
FIG. 2 is an exploded perspective view of the locking mechanism of FIG. 1.
Figure 3:
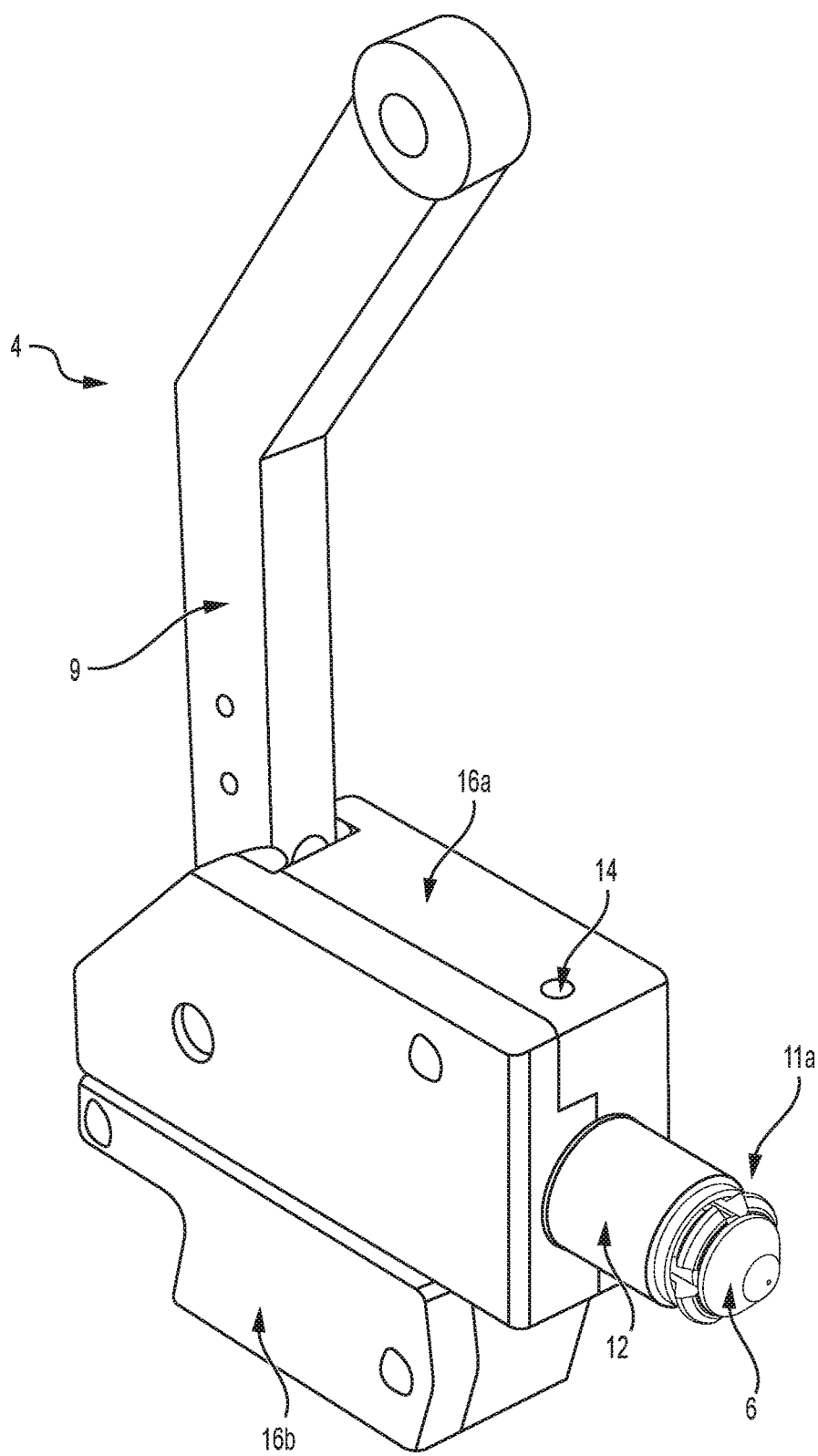
FIG. 3 is a perspective view of the locking mechanism of FIG. 1.
Figure 4:
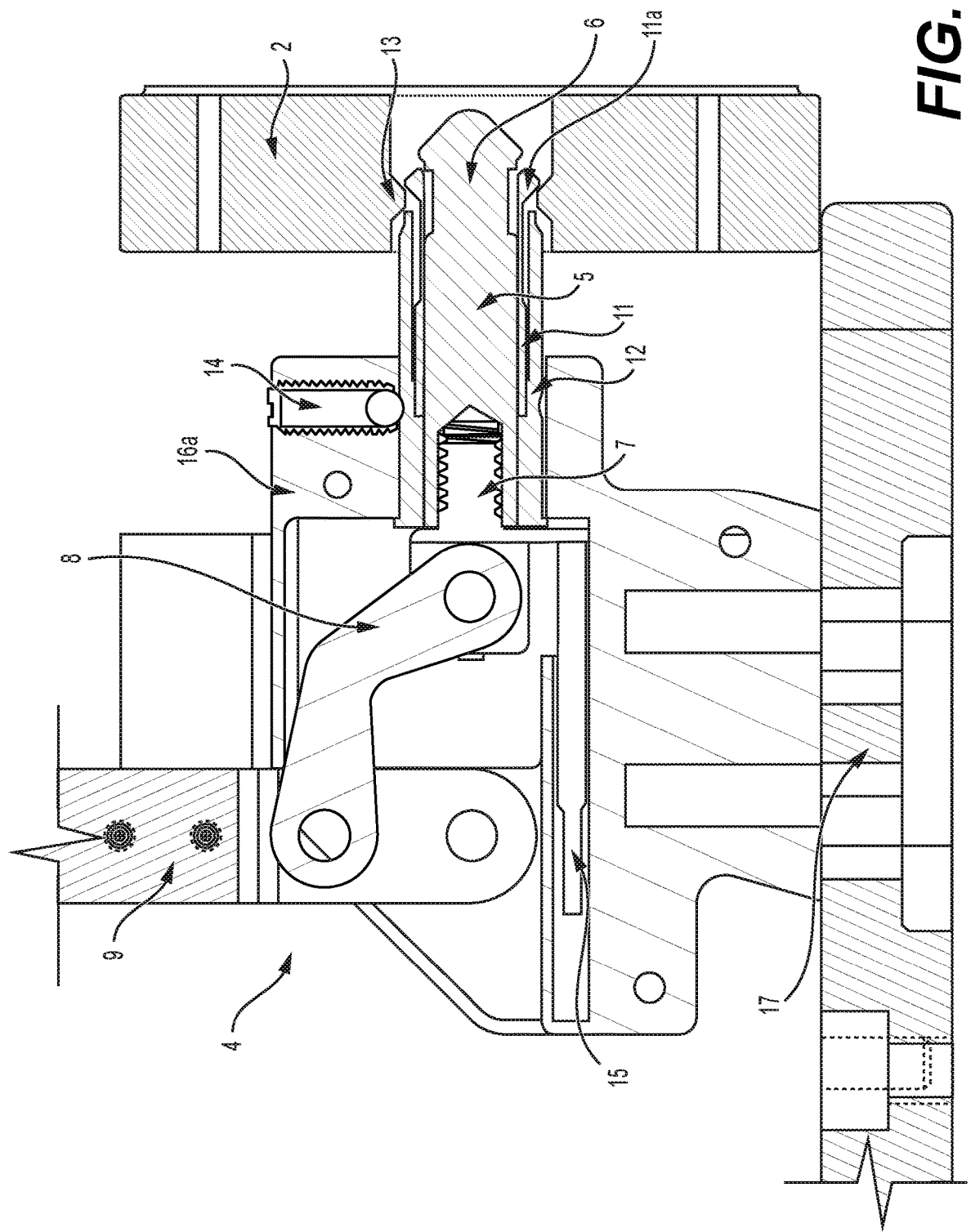
FIG. 4 is a cross-sectional view of the locking mechanism of FIG. 1.
Figure 5:
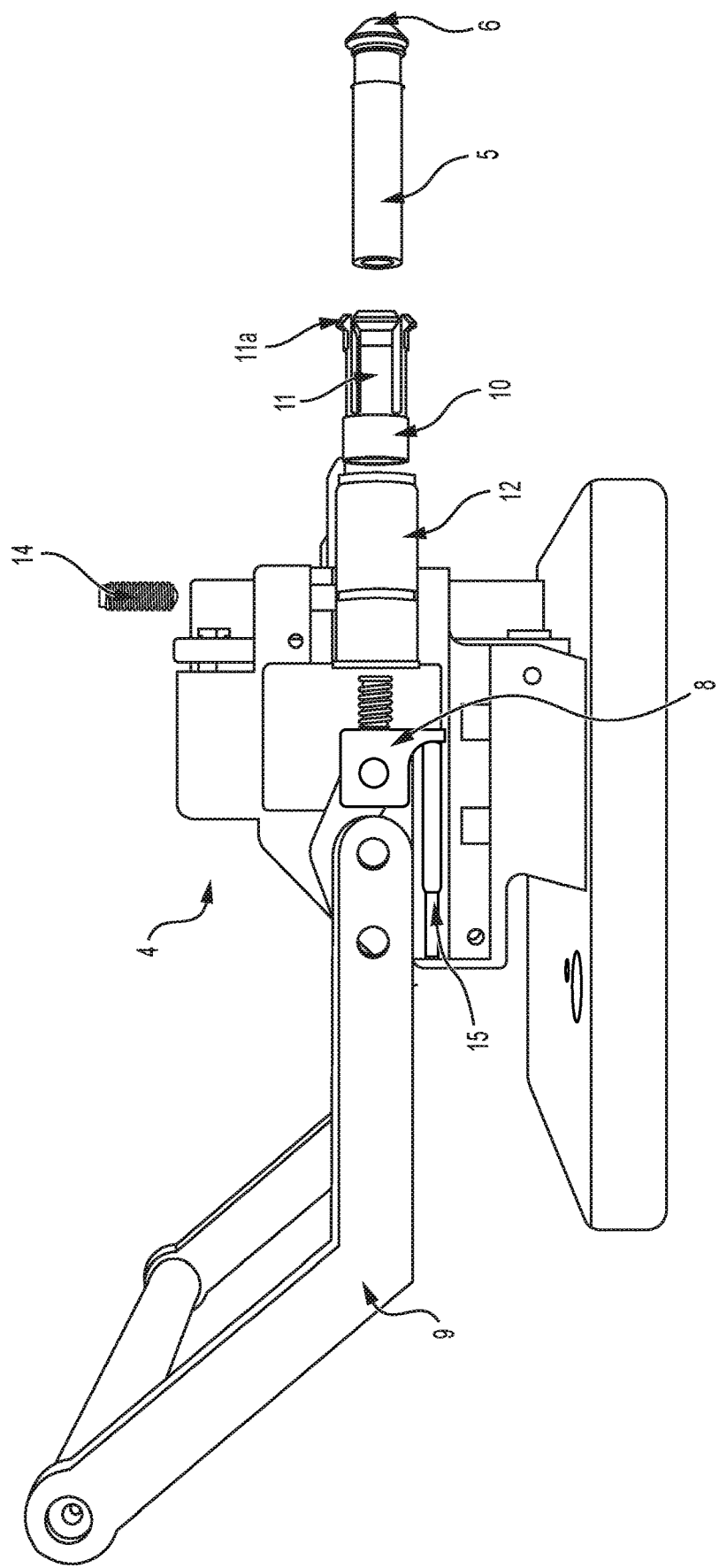
FIG. 5 is an exploded side view of the locking mechanism of FIG. 1.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. This disclosure may be embodied in different forms and should not be construed as limited to the exemplary embodiments set forth herein. Rather, these exemplary embodiments are provided so that this disclosure will be thorough and complete, and will fully convey the scope of the disclosure to those skilled in the art.

In the accompanying figures, the size and relative sizes of layers, regions, etc., may be exaggerated for clarity and descriptive purposes. Also, like reference numerals denote like elements. When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

The engaging device according to exemplary embodiments of the present disclosure is designed for use in applications that require more I/O and a more compact size than existing solutions. As shown in FIG. 1, an engaging device 1 according to an exemplary embodiment has an interchangeable test adapter (ITA) 2 configured to be attached to a test fixture, and a receiver 3 configured to have cabled connections to a test instrument, designed for use in both desktop and rack-mounted applications.

While the engaging device 1 according to the present exemplary embodiment features a manually operated, linkage-based, over-dead-center locking mechanism 4, a locking mechanism of the engaging device according to other exemplary embodiments may be attached directly to pneumatic cylinders, allowing the engaging device to be used in fully automated settings. Parallel locking mechanisms 4 having handles connected by a handlebar may be used to engage the ITA 2, ensuring both handles move together. This synchronized movement ensures the ITA 2 and receiver 3 surfaces remain substantially parallel during engagement and disengagement processes.

The engaging device 1 according to the present exemplary embodiment includes a locking mechanism 4 that relies on plunger-driven motion to engage and disengage an ITA with a receiver. As shown in FIG. 2, FIG. 3, FIG. 4, FIG. 5, and FIG. 6, the locking mechanism 4 includes a plunger 5 having a head 6, the plunger 5 connected to a plunger base 7 at an opposite side of the plunger head 6. The plunger base 7 is connected to an over-dead-center (ODC) link 8, and the ODC link 8 is also connected to a rotatable handle 9.

Figure 6:
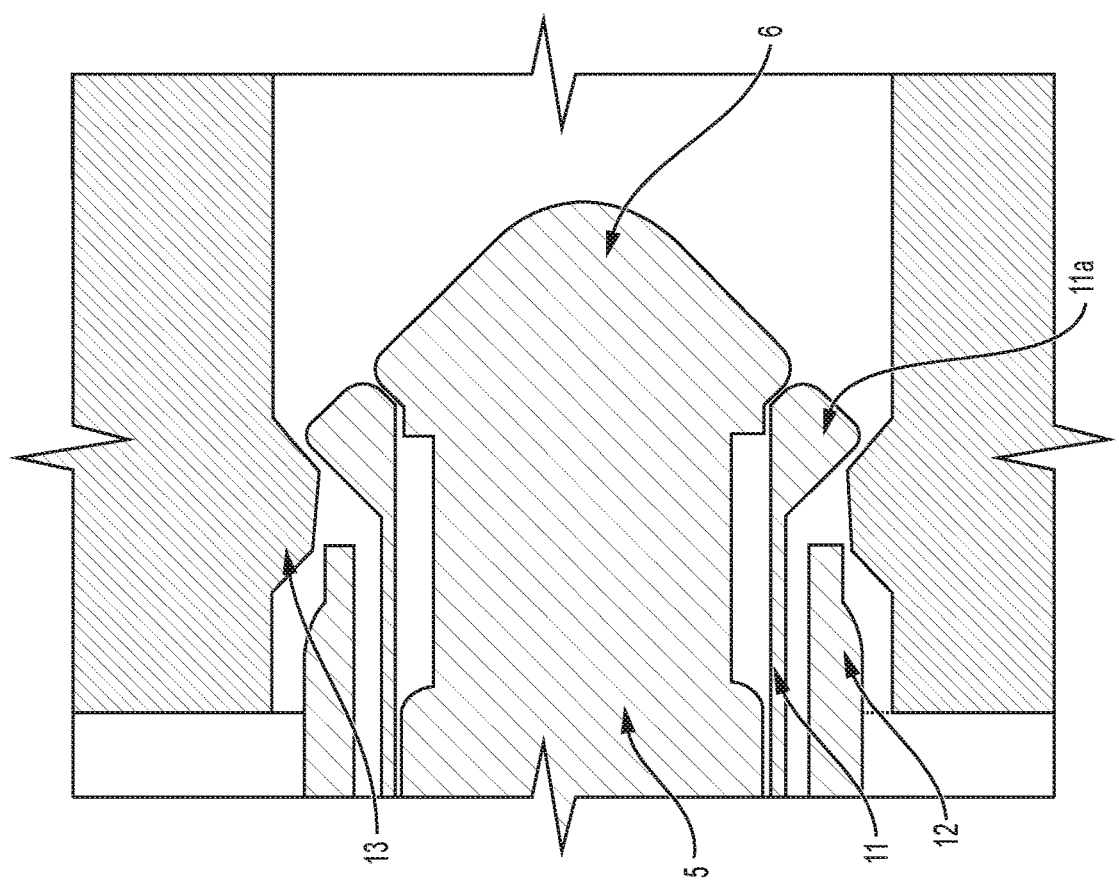
FIG. 6 is an inset cross-sectional view of the locking mechanism of FIG. 2.
Figure 7:
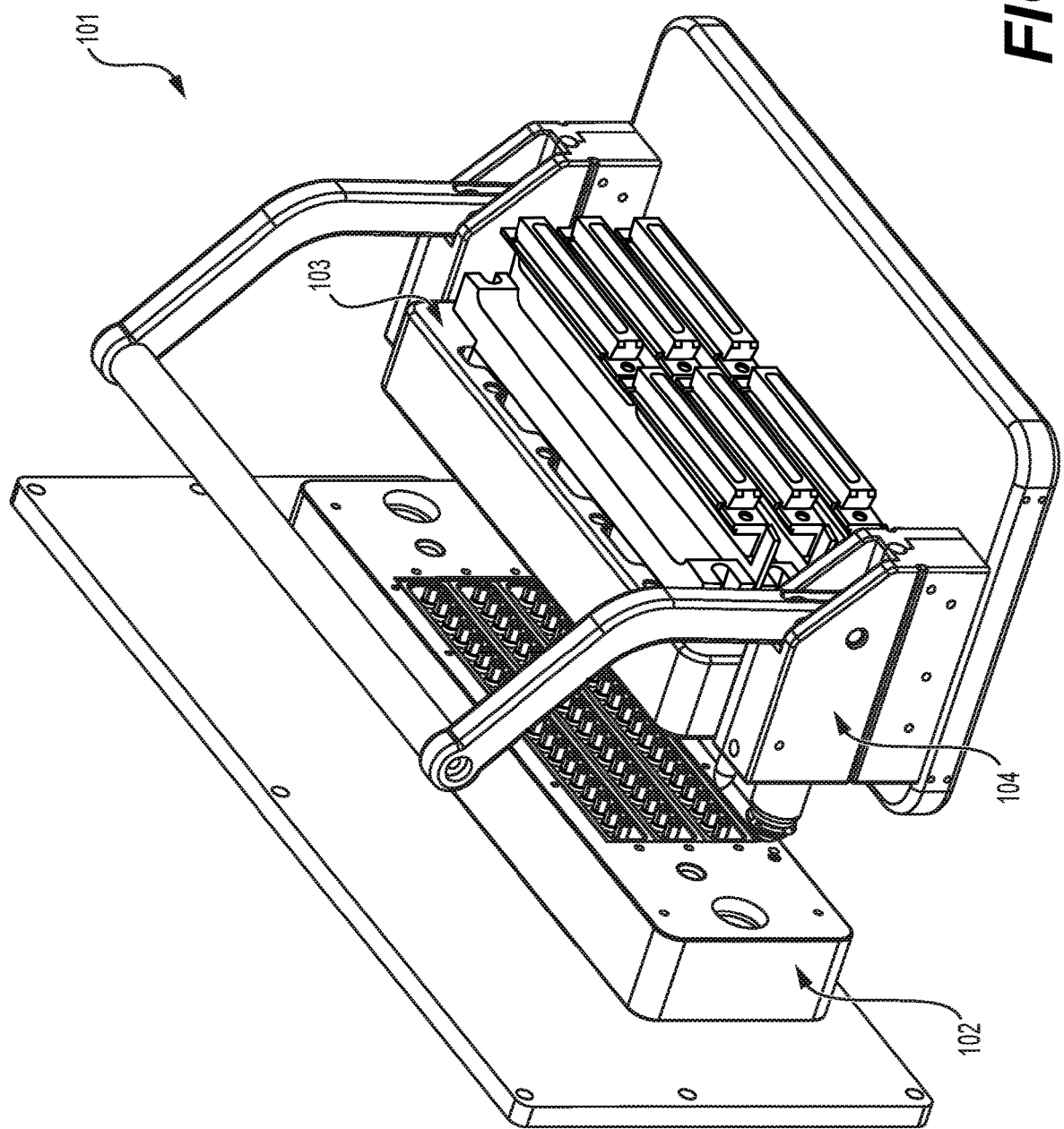
FIG. 7 is a perspective view of an engaging device including a locking mechanism according to another exemplary embodiment.
Figure 8:
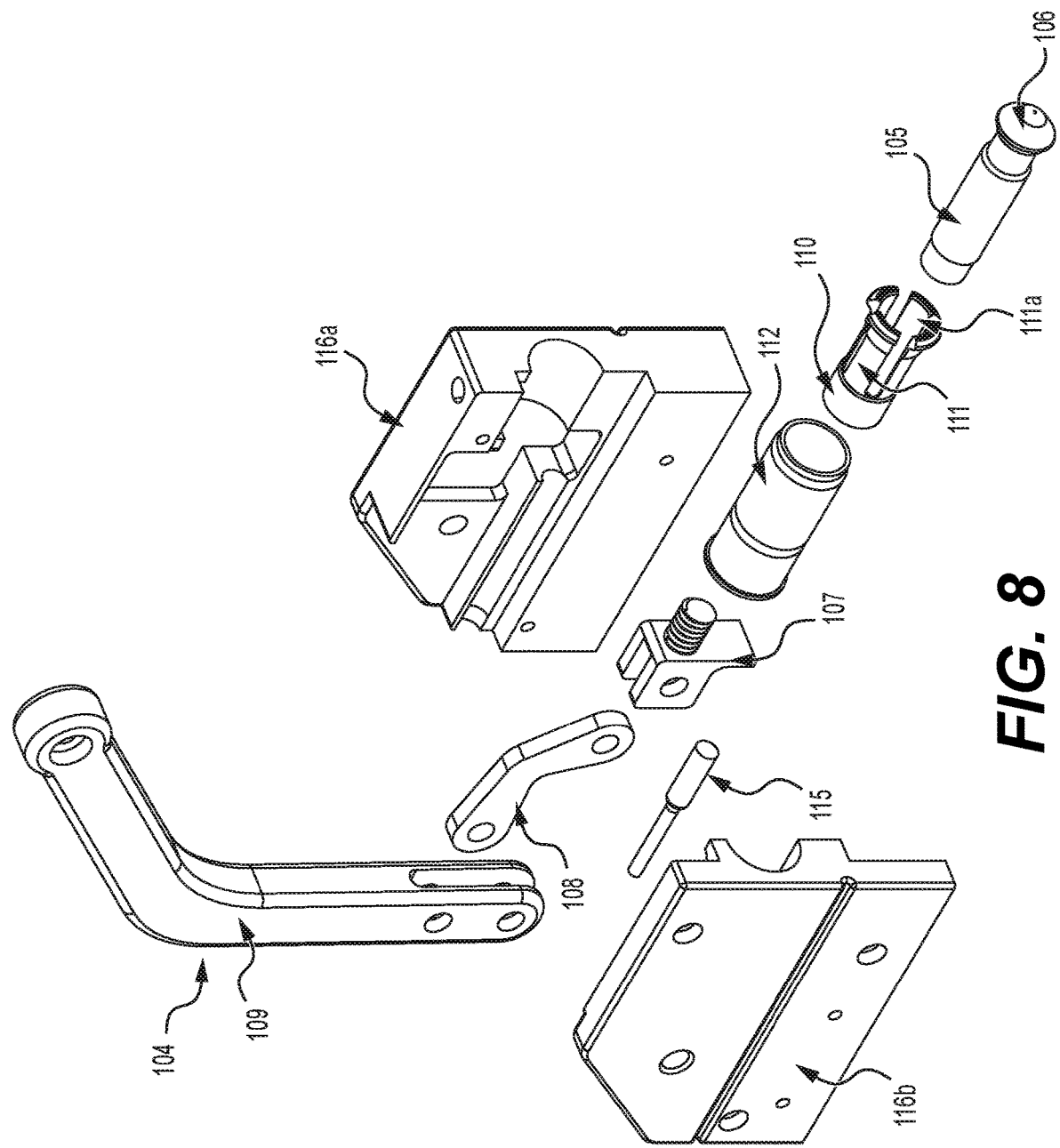
FIG. 8 is an exploded perspective view of the locking mechanism of FIG. 7.
Figure 9:
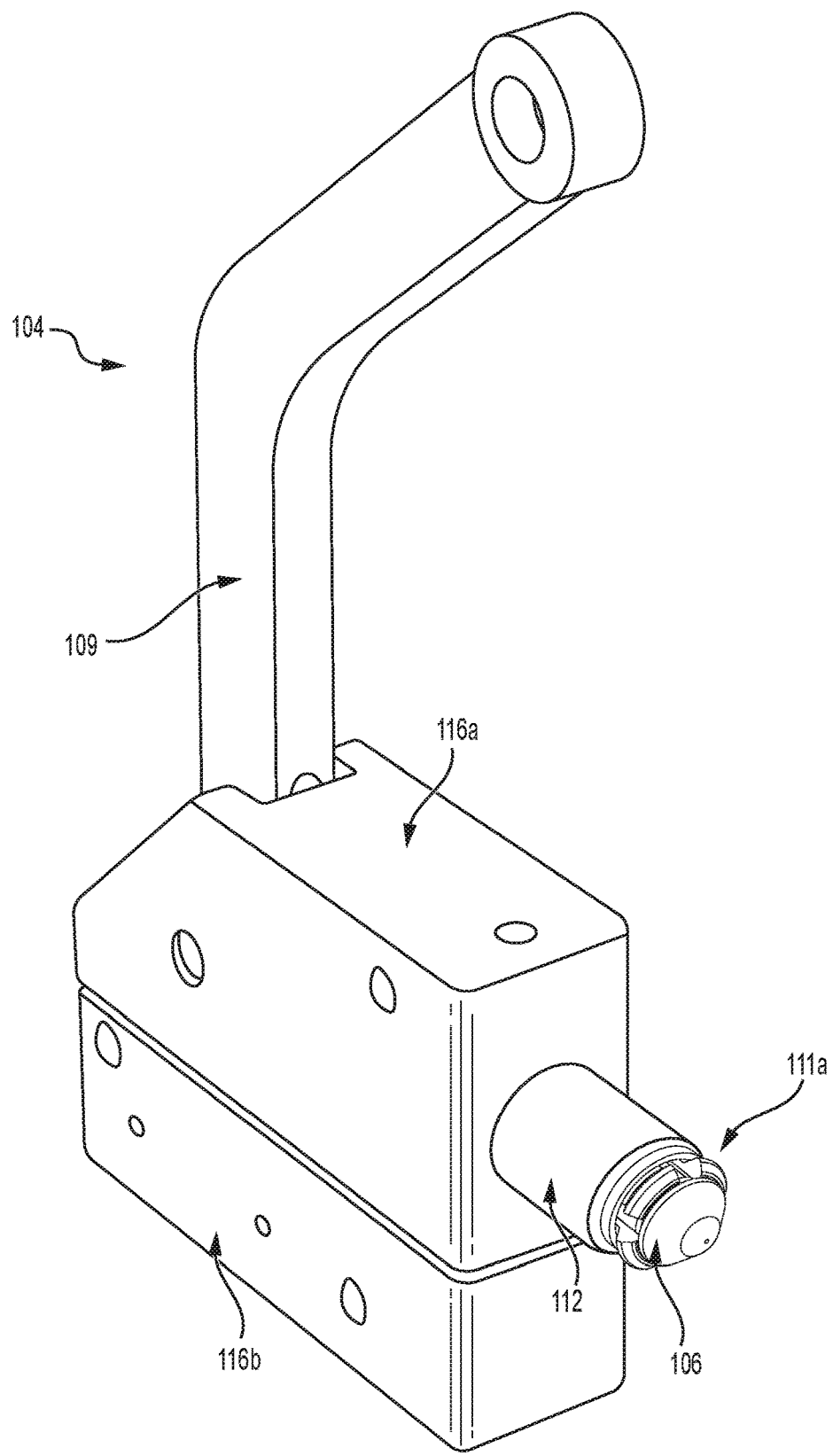
FIG. 9 is a perspective view of the locking mechanism of FIG. 7.

The locking mechanism 4 further includes a leaflet insert 10 press-fitted in a sleeve 12, the leaflet insert 10 disposed over the plunger 5. Leaflets 11 are disposed at the end of the leaflet insert 10, the leaflets 11 having locking tabs 11a on the tips thereof. The leaflet insert may be made of thin metal, which allows the locking tabs 11a to easily snap in/out of a locking bushing 13. In an exemplary embodiment, the locking bushing 13 may be 0.025 inches smaller in diameter than the outer diameter of the locking tabs 11a on the leaflets. The leaflets 11 may bend inwards to enter/exit the locking bushing 13, but hold fast when the plunger 5 is in a locked position (as shown in FIG. 6).

The plunger 5 is configured to engage and disengage the leaflets 11 from the locking bushing 13 positioned in the ITA 2. During an engaging process, as described in detail below, once the plunger 5 is engaged with the ODC link 8 in an over-dead-center position, the plunger 5 is in the locked position and prevents the leaflets 11 from bending inwards, and pulls the receiver 3 into engagement with the ITA 2.

The plunger head 6 fills the space between leaflets 11 to prevent the leaflets 11 from slipping out of the locking bushing 13 when the locking mechanism 4 is engaged and locked. As shown in FIG. 6, according to an exemplary embodiment, the plunger head 6 may have a 0.030 inch portion having a same diameter as the main shaft of the plunger 5, and which is disposed after a depression portion in the plunger 5 and before the angled face of the plunger head 6 that matches the angle on the locking tabs 11*a*. The depression portion may allow the leaflets 11 to bend inwards when the locking tabs 11*a* engage or disengage from the locking bushing 13. Accordingly, the plunger head 6 fills in the space between the leaflets 11. The plunger head 6 may have a 45° angle to smoothly transfer force from plunger 5 to the locking bushing 13 with minimal strain in the leaflets 11. The plunger 5, the ODC link 8, the rotatable handle 9, and the sleeve 12 may bear substantially all of the force (i.e., about 90% or greater) required to engage and disengage the ITA 2. The leaflets 11 may bear no significant stress during the engaging/disengaging process, as the locking tabs 11*a* at the tips of the leaflets 11 transfer the force from the plunger 5 directly to the locking bushing 13 when engaging.

Accordingly, the leaflets 11 may bear no significant longitudinal forces without simultaneous contact with the plunger head 6 and locking bushing 13. The only strain in the leaflets 11 may occur when they bend inwards as they are inserted into the locking bushing 13 on the ITA 2. According to an exemplary embodiment, the leaflets 11 allow for 0.025 inches of interference when the plunger 5 is in the locked position. For example, when the plunger 5 is in the engaged position, filling the inside of the leaflets 11, the diameter of the locking tabs 11*a* may be 0.025 inches larger than the opening of the locking bushing 13. The leaflet insert 10 may be protected from bending to the point of plastic deformation by the shaft of the plunger 5 on the inside and protective sleeve 12 into which the leaflet insert 10 is press-fit on the outside.

The locking mechanism 4 also includes a ball plunger 14, which may provide resistive force to keep the sleeve 12 fully forward until engaged by the plunger 5, ensuring the locking mechanism 4 is not locked while trying to clip into the locking bushing 13. A spring plunger 15 may apply pressure to keep the plunger 5 forward while docking with the locking bushing 13 to prevent the locking mechanism 4 from locking before acted on by the ODC link 8 and rotatable handle 9. The elements of the locking mechanism 4 described above may be enclosed or partially enclosed within a body having first body section 16*a* and second body section 16*b*. According to an exemplary embodiment, the engaging device 1 has adjustable positioning 17, with 0.075 inches of space to move the locking mechanism 4 forward or backwards, for adjusting engagement depth.

An engaging device 101 according to an exemplary embodiment is shown in FIG. 7, FIG. 8, FIG. 9, FIG. 10, FIG. 11, and FIG. 12. The engaging device 101 according to the present exemplary embodiment may be substantially similar in various respects to the engaging device 1 as described with respect to FIG. 1, FIG. 2, FIG. 3, FIG. 4, FIG. 5, and FIG. 6 of the present application, and the disclosure thereof is incorporated herein by reference, and any repeated disclosure may be omitted for the sake of brevity. Likewise, the disclosure with respect to the engaging device 101 described in connection with FIG. 7, FIG. 8, FIG. 9, FIG. 10, FIG. 11, and FIG. 12 is incorporated by reference into the exemplary embodiment described with respect to FIG. 1, FIG. 2, FIG. 3, FIG. 4, FIG. 5, and FIG. 6.

As shown in FIG. 7, FIG. 8, FIG. 9, FIG. 10, FIG. 11, and FIG. 12, a locking mechanism 104 according to an exemplary embodiment includes several key components and assembly steps. First, a handle 109 is connected to an over-dead-center (ODC) link 108 using a first dowel pin (not shown). The ODC link 108 has a "dogleg" shape that allows the handle 109 to be articulated without interference from the first dowel pin around which the handle 109 rotates. Next, the ODC link 108 is connected to a plunger base 107 via a second dowel pin (not shown), and a plunger 105 is screwed onto threads on the plunger base 107 until the plunger 105 is flush with the plunger base 107. Thread locking tape or a coating may be utilized to prevent the plunger 105 from unscrewing from the plunger base 107 during repeated cycles.

The locking mechanism 104 also includes a leaflet insert 110 press-fitted into a sleeve 112, which then floats over the plunger 105 between the plunger base 107 and a plunger head 106. Once the plunger 105 is screwed on the plunger base 107, the sleeve 112 may move laterally along the plunger 105 in a range of about 0.050 inches to about 0.055 inches. This range of lateral movement may allow leaflets 111 connected to the front of the leaflet insert 110 to close freely over the plunger 105, while locking tabs 111*a* of the leaflets 111 lock outwards when an angled portion of the plunger head 106 meets an angled portion on the inside of the locking tabs 111*a*.

Figure 12:
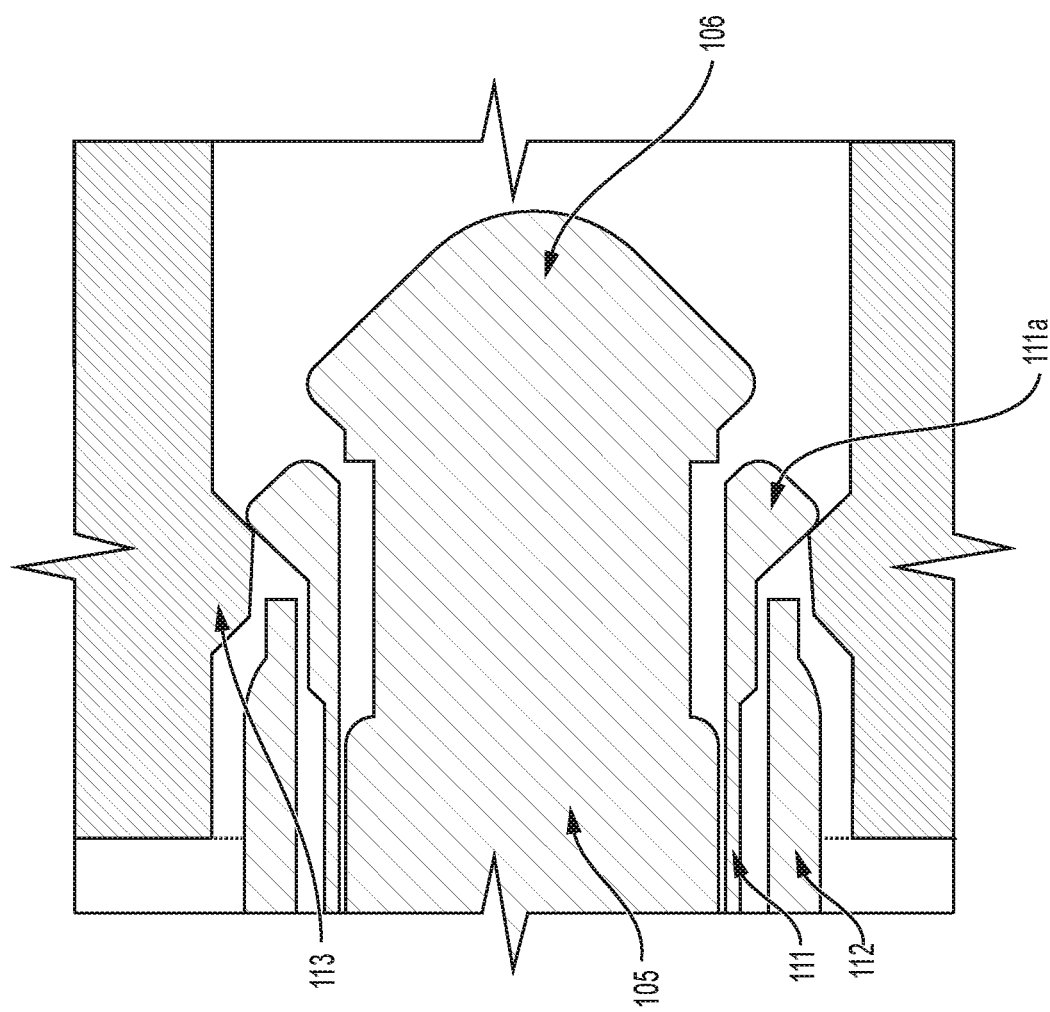
FIG. 12 is an inset cross-sectional view of the locking mechanism of FIG. 8.

For example, as shown in detail in FIG. 12, the plunger 105 may have a smaller diameter than an interior diameter between the leaflets 111. The locking tabs 111*a* lock outwards against a locking bushing 113 when the angled portion of the plunger head 106 meets the corresponding angled portion on the inside of the locking tabs 111*a*. As described above with respect to the exemplary embodiment of FIG. 1 through FIG. 6, when the plunger 105 is in the engaged position, the diameter of the locking tabs 111*a* may be 0.025 inches larger than the opening of the locking bushing 113. The leaflet insert 110 may be protected from bending to the point of plastic deformation by the shaft of the plunger 105 on the inside and protective sleeve 112 into which the leaflet insert 110 is press-fit on the outside.

Further, as shown in detail in FIG. 12, the leaflets 111 may have a tapered, increasing thickness in a thickened portion where the leaflets 111 connect with the locking tabs 111*a*. The thickened portion of the leaflets 111 corresponds to an area where the leaflets 111 extend over a depression portion of the plunger 105 that has a smaller diameter than the remainder of the plunger 105. When the plunger 105 is in the engaged position, the thickened portion may further protect the leaflets 111 from bending outward, should the plunger 105 be retracted into the sleeve 112. This may occur, for example, when the sleeve 112 is held fixed, sometimes by a misaligned ITA 102 with only one set of leaflets 111 engaged with the locking bushing 113.

The entire locking mechanism 104 assembly, including at least the ODC link 108, plunger base 107, plunger 105, leaflet insert 110, leaflets 111, and sleeve 112 is then enclosed within a body having first body section 116*a* and second body section 116*b*. The handle 109 is connected to the body using the first dowel pin, around which the handle 109 rotates. A first cylindrical channel in the body constrains the plunger 105 to linear, horizontal movement with a tight clearance around the sleeve 112. The body may be fastened together with connectors such as screws.

Figure 10:
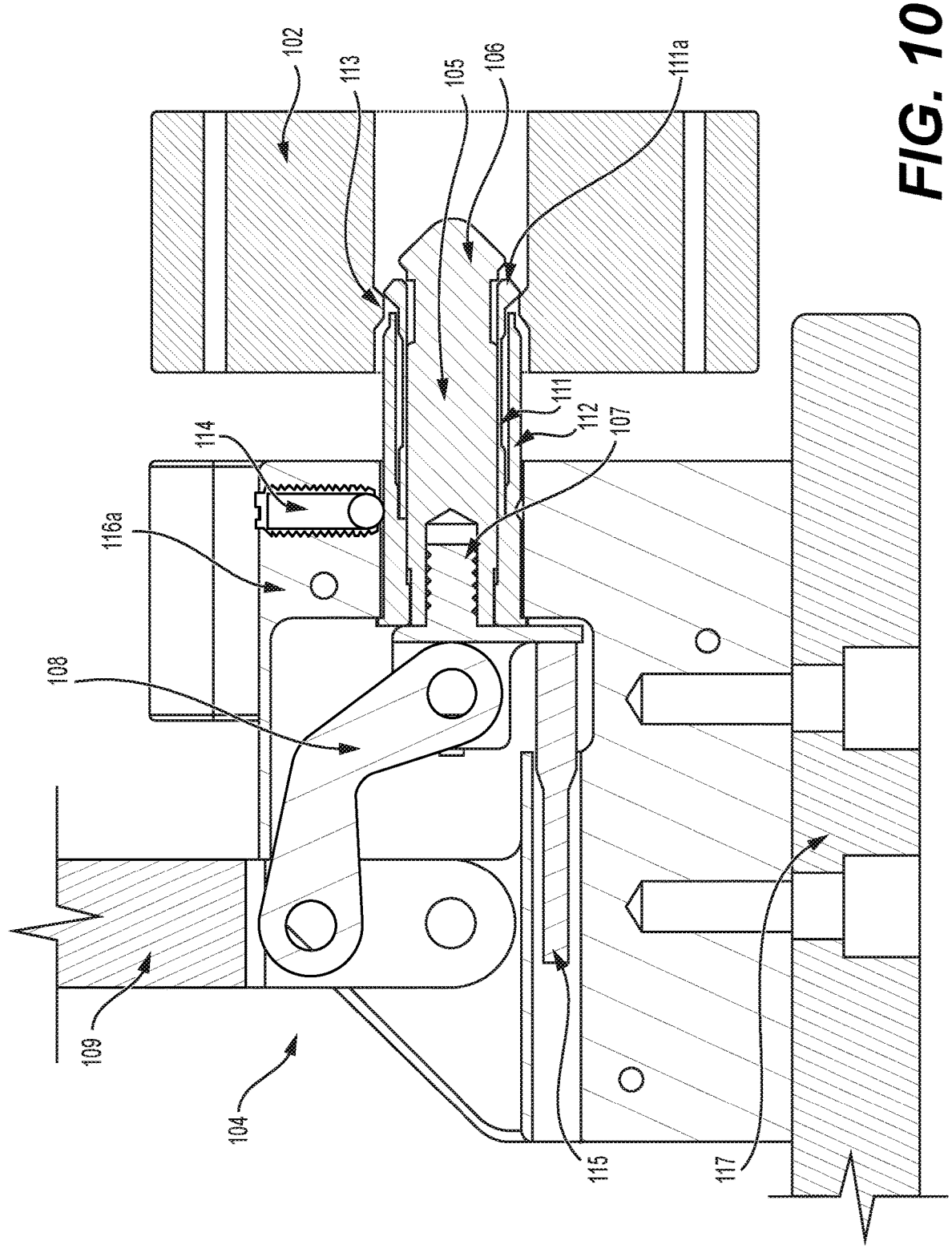
FIG. 10 is a cross-sectional view of the locking mechanism of FIG. 7.
Figure 11:
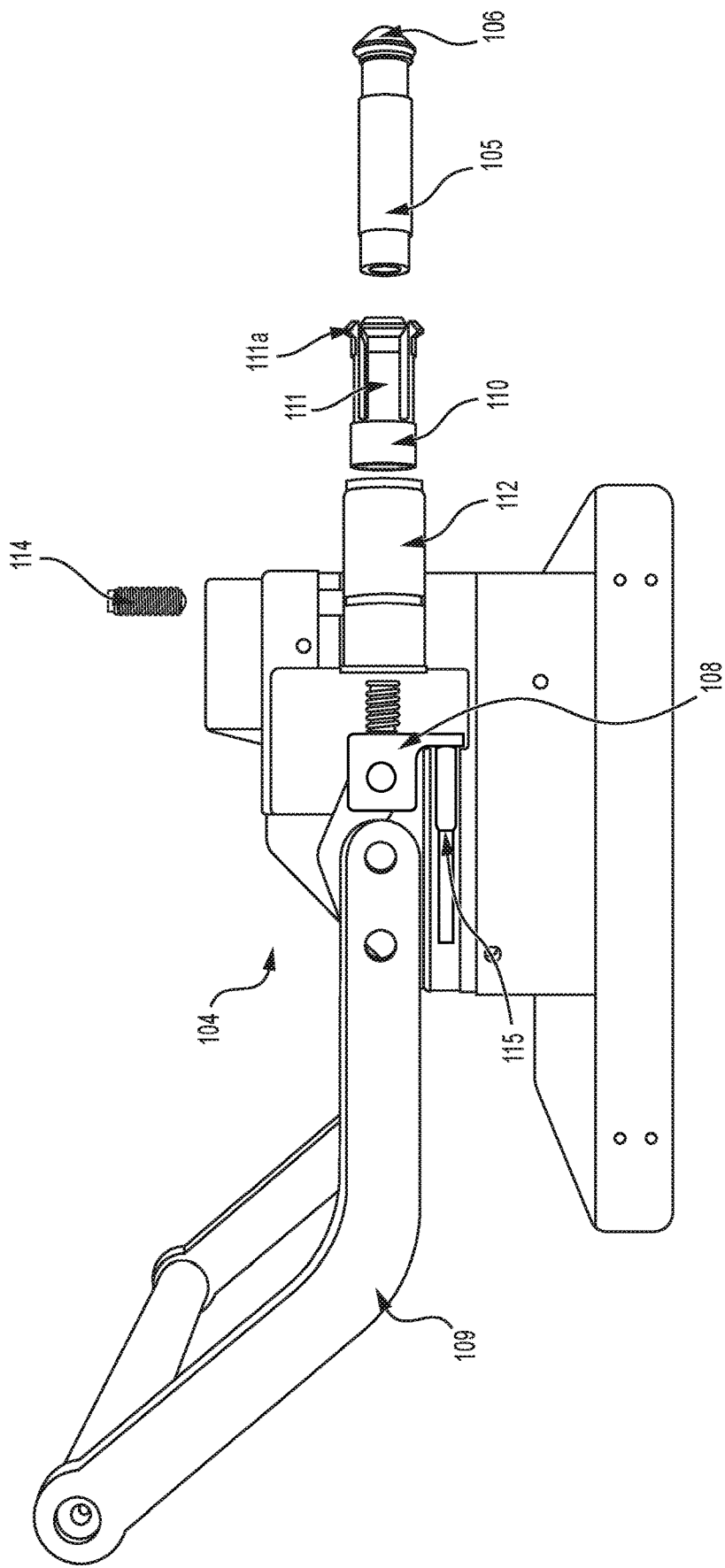
FIG. 11 is an exploded side view of the locking mechanism of FIG. 7.

As shown in FIG. 10, a smaller second cylindrical channel in the body houses a spring (not shown) and a spring plunger 115. The spring sits loosely on a thinner end of the spring plunger 115, and both components are loaded into the assembled body with a thicker end of the spring plunger 115 first. A set screw (not shown) inserted in the body behind the spring secures the spring and spring plunger 115 in place, and may compress the spring and apply pressure on a flange of the plunger base 107 to keep the plunger 105 forward, in the absence of other forces on the handle 109.

A spring-loaded ball plunger 114 is screwed into the top of the body, so the ball thereof may rest in a groove on the sleeve 112 when the locking mechanism 104 is in an open position, as shown in FIG. 10. This may keep the sleeve 112 in place until the angled portion of the plunger head 106 makes contact with the angle on the inside of the leaflets 111. The ball plunger 114 may keep the sleeve 112 in a retracted position, preventing friction between the plunger 105 and sleeve 112 and drawing the sleeve 112 back before the leaflets 111 are locked outwards by the plunger head 106. This design may prevent the leaflets 111 from slipping out of the locking bushing 113 (or "grab-ring") of the ITA 102 during the engaging process.

According to an exemplary embodiment, the locking mechanism 104 may operate in four main steps. First, during an attachment process, an ITA 102 slides onto the leaflets 111/sleeves 112 and tooling pins of the receiver 103. The leaflets 111 collapse inwards and then spring back into an open position once they move past the locking bushing 113. Second, during an engaging process, the handle 109 is pulled back by a user until it stops, causing it to rotate approximately 90°, which in turn pulls the plunger 106 back via the plunger base 107 and ODC link 108.

The angled surface on the back of the plunger head 106 comes into contact with the angled surface on the inside of the locking tabs 111a, preventing the leaflets 111 from collapsing inwards again. As the handle 109 pulls the plunger back 105, the plunger 105 simultaneously pulls the sleeve 112 back. The angled surface on the back of the locking tabs 111a contacts the angled surface on the far side of the locking bushing 113. The plunger 105 pulls the leaflets 111, which then pull the locking bushing 113, drawing the ITA 102 closer to the receiver 103.

Once the handle 109 is fully pulled back (90° rotation) and the sleeve 112 is close to or in contact with backstops inside the locking mechanism 104, the electrical contacts of the ITA 102 and receiver 103 may be fully connected. The handle 109 aligns with the plunger 105, providing over-dead-center (ODC) locking to prevent any motion on the ITA 102 side from disengaging the contacts.

Third, during a disengagement process, the lever 109 is moved forward, pushing the plunger 105 and sleeve 112 forward and separating the ITA 102 from the receiver 103. The plunger 105 is pushed forward until the plunger head 106 loses contact with the leaflets 111. Then, the plunger 105 continues moving forward until the plunger base 107 pushes the base of the sleeve 112 forward. The rounded shoulder on the front of the sleeve 112 comes into contact with the near side of the locking bushing 113, pushing the ITA 102 off of the receiver 103. The locking mechanism 104 then returns to the open position, and the ITA 102 rests on the sleeve 112/leaflets 111 and tooling pins of the receiver 103 again.

Finally, during a removal process, the ITA 102 is pulled off while the angled face of the far side of the locking bushing 113 compresses the leaflets 111. Once the leaflets 111 have a small enough outer diameter to slide out of the locking bushing 113, the ITA 102 can be completely removed from the receiver 103.

An engagement and disengagement process of an engaging device according to an exemplary embodiment is shown in FIG. 13, FIG. 14A, FIG. 14B, FIG. 15A, FIG. 15B, FIG. 16, FIG. 17A, FIG. 17B, FIG. 18, and FIG. 19. The engaging device of the present exemplary embodiment may be substantially the same as the engaging device 1 as described above with respect to FIG. 1, FIG. 2, FIG. 3, FIG. 4, FIG. 5, and FIG. 6, and the disclosure thereof is incorporated herein by reference, and any repeated disclosure may be omitted for the sake of brevity. The engaging device of the present exemplary embodiment may be substantially similar in various respects to the engaging device 101 described in connection with FIG. 7, FIG. 8, FIG. 9, FIG. 10, FIG. 11, and FIG. 12, and the disclosure of the present exemplary embodiment is incorporated therein by reference.

During an engagement process of an engaging device according to the present exemplary embodiment, as shown in FIG. 13, FIG. 14A, FIG. 14B, FIG. 15A, FIG. 15B, and FIG. 16, the plunger may travel 0.350 inches during a full 90° rotation of the handle. For example, the handle may start in a vertical docking position, and during the engagement process the handle is rotated 90° to a locked ODC position. All angles that are not zero or 90° may fluctuate in a range of about +/−3°, depending on tolerances and positioning of the components in the locking mechanism assembly.

Figure 13:
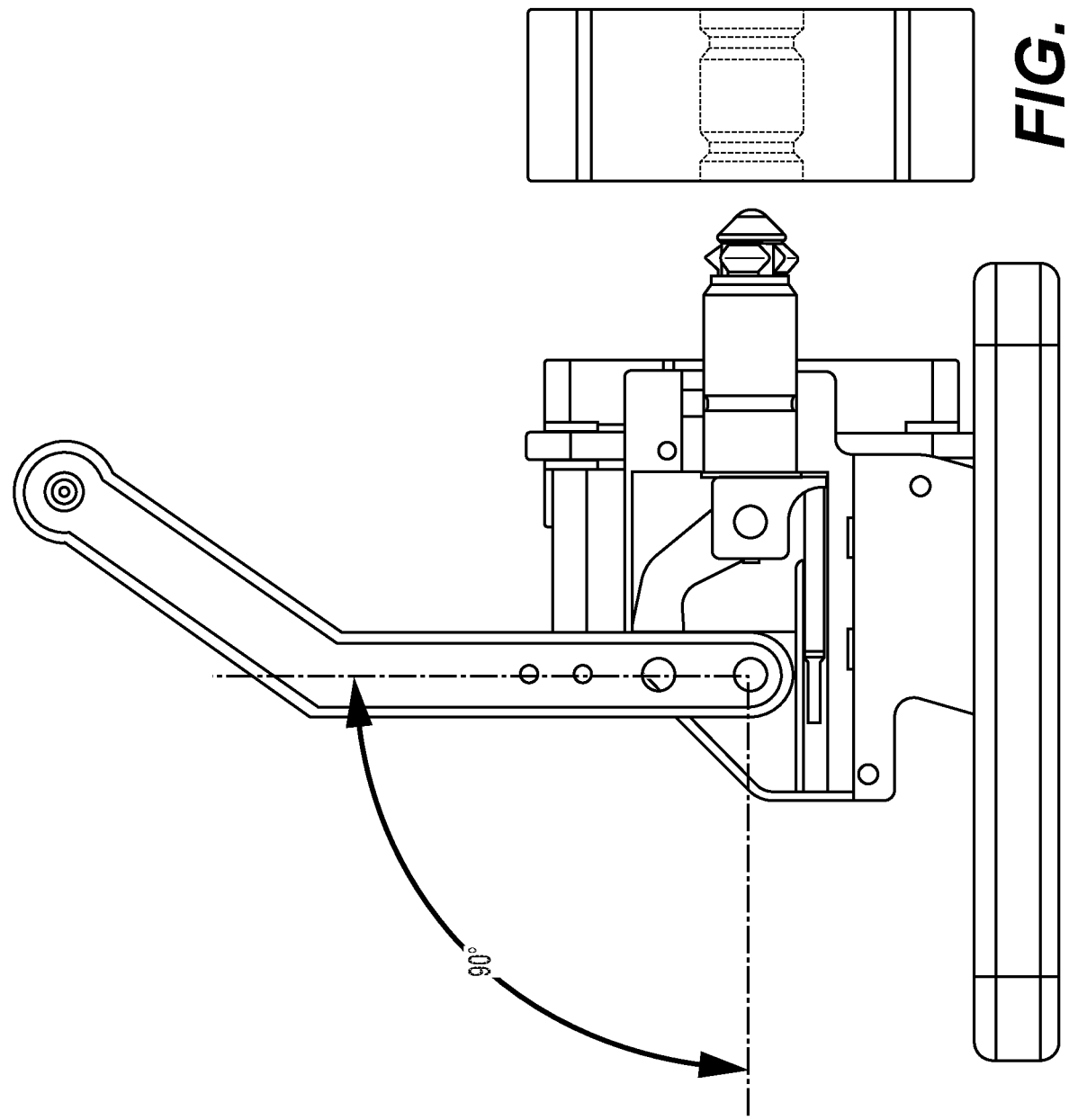

During a first docking step (90°), as shown in FIG. 13, the locking mechanism is in an unlocked/open position and may be freely inserted into the locking bushing of the ITA. First, a user aligns tooling pins with corresponding bushings. Then, the user slides the ITA and receiver sides together until there is resistance, indicating that the locking tabs have compressed and clicked into place inside the locking bushing.

In a second docking step (87°-85° of handle rotation), as shown in FIG. 14A and FIG. 14B, the locking mechanism is in a locked position. The plunger head may be between leaflets to hold them open but the locking tabs may not contact the back of the locking bushing. Throughout the present exemplary embodiment, as shown in FIG. 13, FIG. 14A, FIG. 14B, FIG. 15A, FIG. 15B, and FIG. 16, an internal structure of the ITA, including the locking bushing and portions of the locking mechanism as inserted into the ITA, is shown with dashed lines.

Figure 15A:
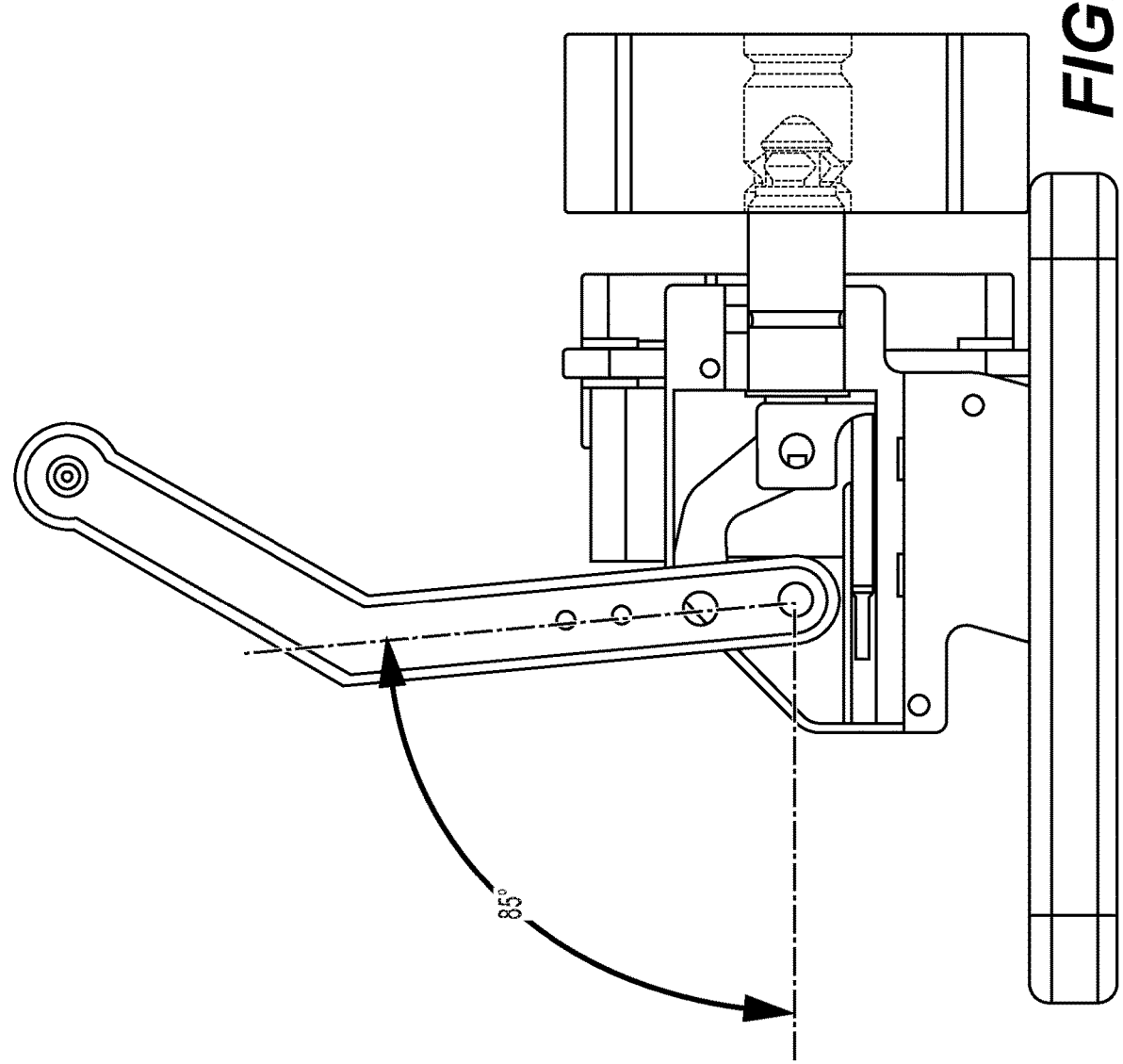

During an engagement step (85°-76° of handle rotation), as shown in FIG. 15A and FIG. 15B, the ODC link pushes the plunger 0.050 inches into the locked position, keeping the leaflets from compressing inward. For example, as the user begins pulling the handle backwards, the sleeve of the locking mechanism may be held in position by the ball plunger until the 45° face of the main plunger comes into contact with the corresponding edge of the leaflets. The backs of the locking tabs may contact the locking bushing in the ITA, and the plunger head pulls on the locking bushing through the material of the locking tabs to begin bringing the ITA and receiver together.

Figure 16:
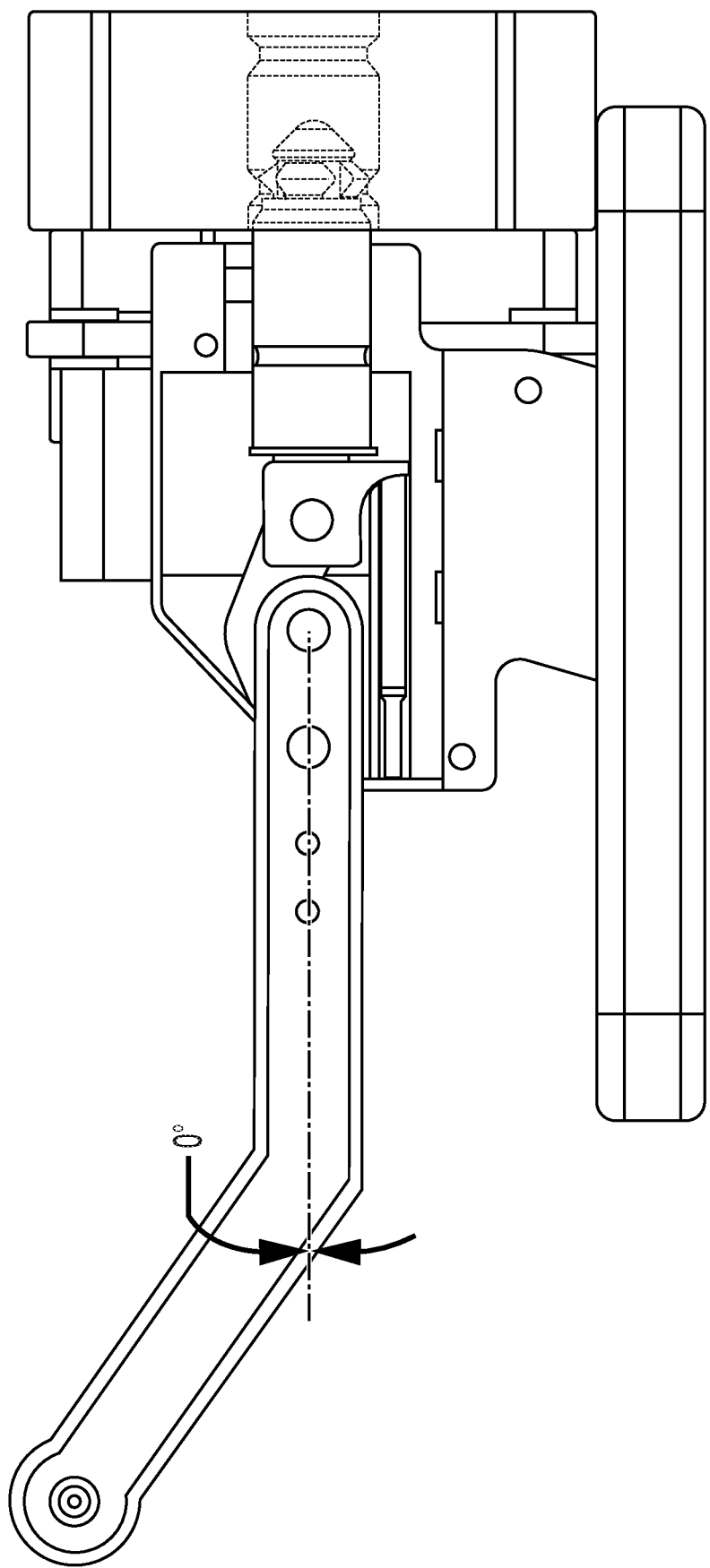

During 76°-0° of handle rotation, the plunger travels a further 0.300 inches into the engaged position/locked ODC position, and the ODC link is in over-dead-center position. The plunger pulls the ITA and receiver together for full engagement. In the engaged position, as shown in FIG. 16, the plunger head fully fills the space between the leaflets, preventing them from bending inwards, and the locking tabs may contact the locking bushing, as also shown in FIG. 6. The contacts are fully engaged when the handle is aligned parallel to a base plate of the engaging device. In an embodiment, over-dead-center locking may prevent the ITA and receiver sides from being pulled apart until the engaging device is intentionally disengaged.

Figure 17A:
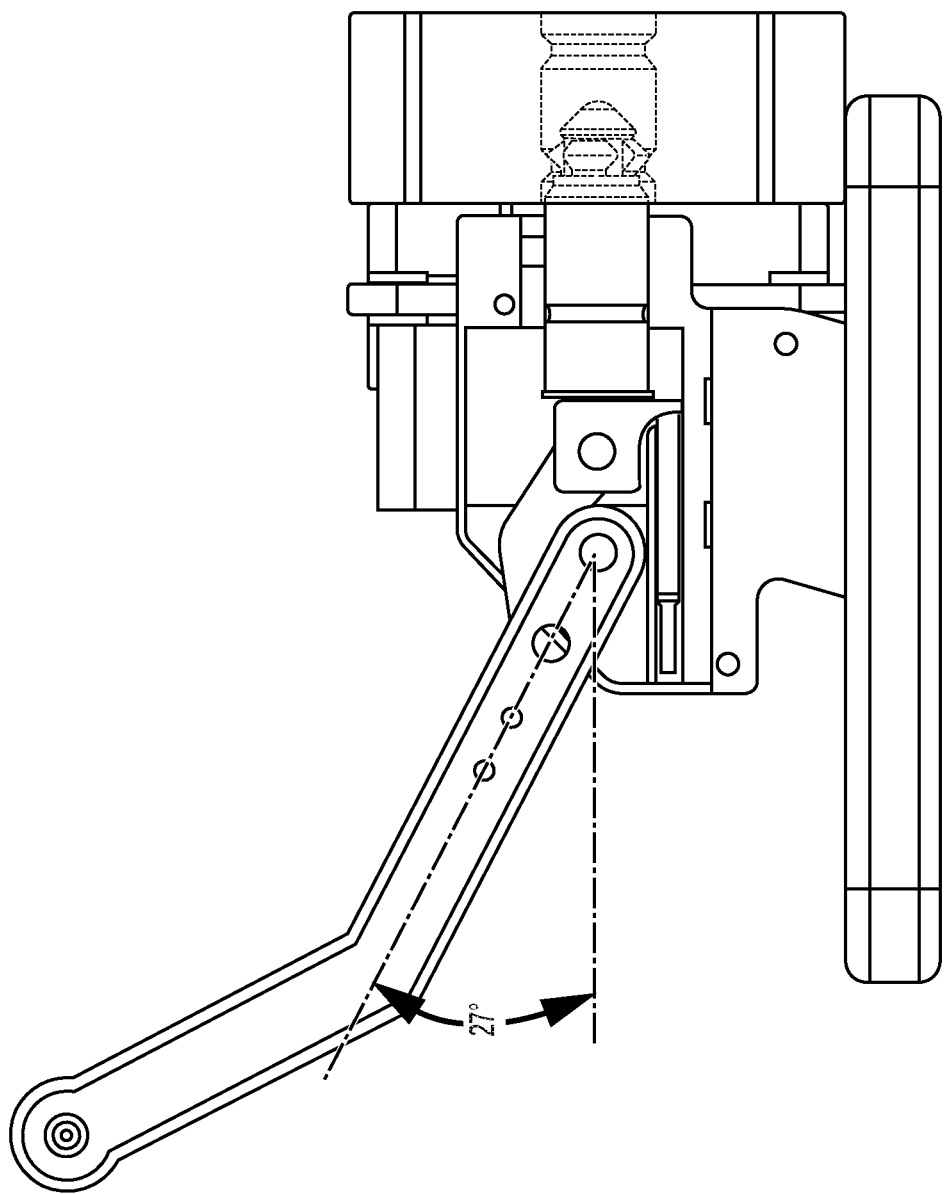
Figure 17B:
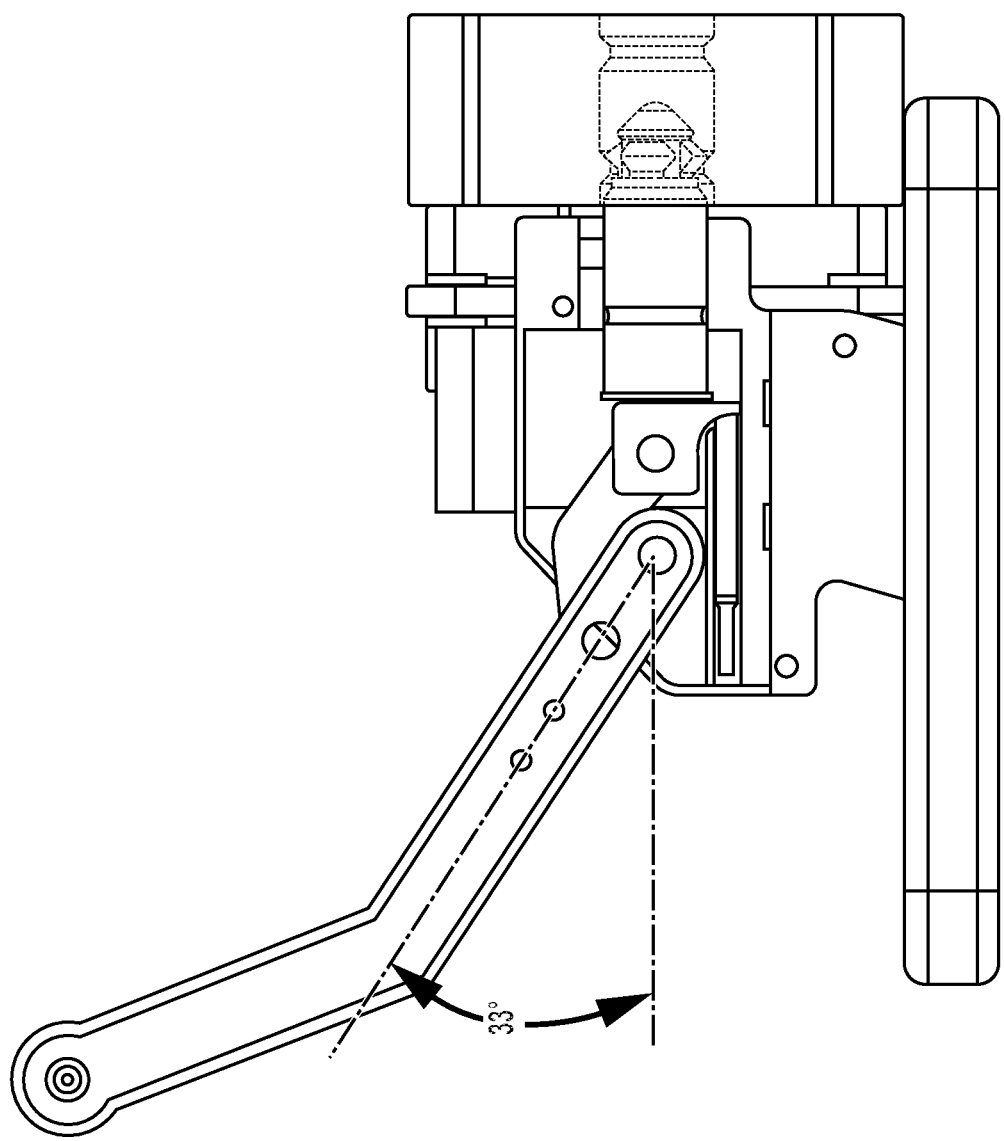
Figure 18:
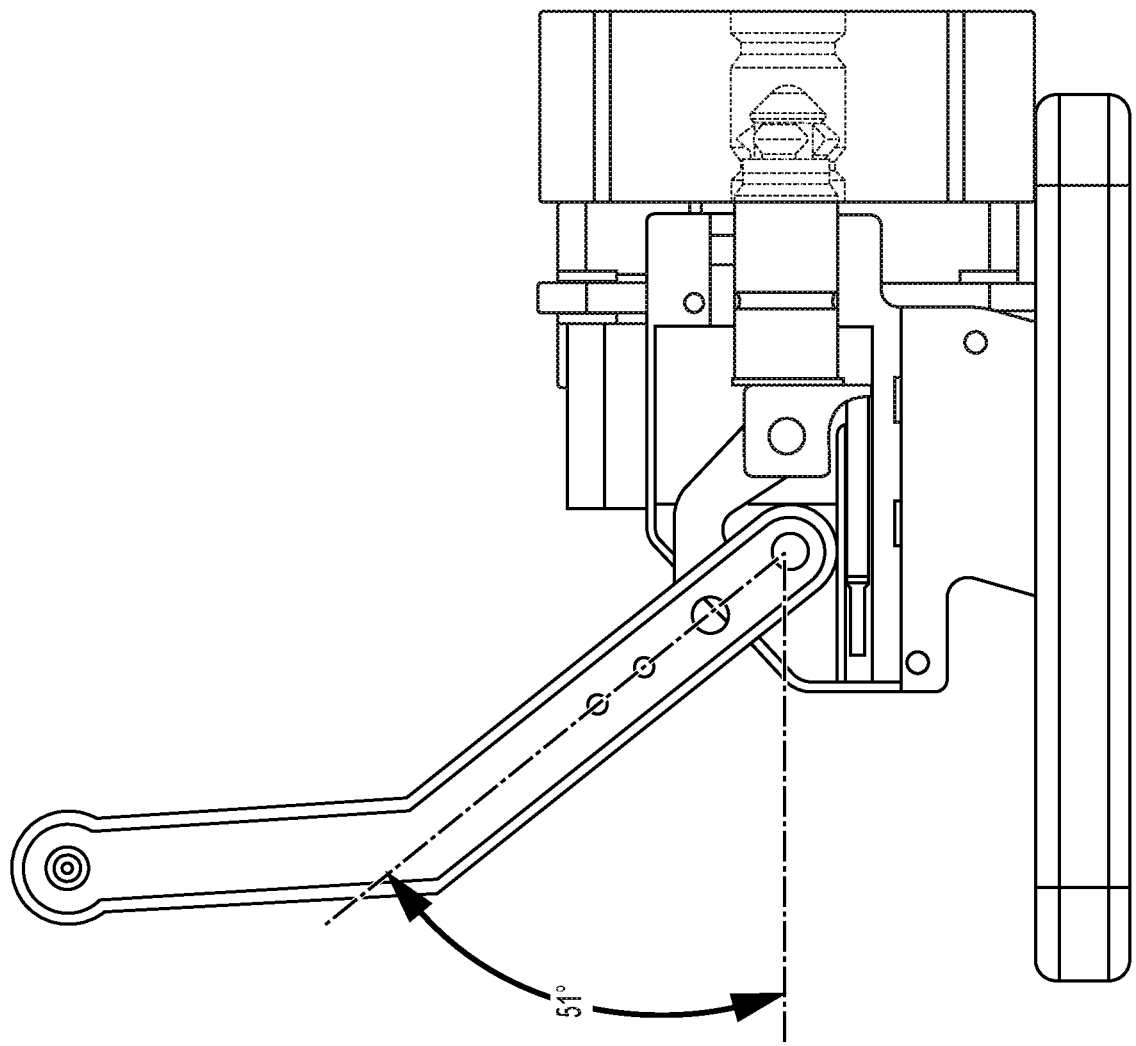

According to an exemplary embodiment, a disengagement process of the engaging device may occurs in an opposite order as the engagement process as described above, as shown in FIG. 17A, FIG. 17B, FIG. 18, and FIG. 19. As the handle moves from a 0° locked position to an unlocked position (27°-35° of handle rotation), the plunger loses contact with the leaflets and the plunger base begins to push on the bottom of the sleeve, as shown in FIG. 17A and FIG. 17B. The plunger head may be clear of the leaflets, allowing them to collapse inwards when the ITA is pulled off, the receiver and ITA only held together by force from engaged contacts.

During an intermediate disengagement step of travel through the locking bushing (33°-51° of handle rotation), the plunger base pushes the sleeve forward, initially removing the locking tabs from contact with a far side of the locking bushing, until the shoulder on the front of the sleeve makes contact with the receiver-facing side of the locking bushing. As the handle moves towards a disengagement position (51°, shown in FIG. 18), a shoulder at the end of the sleeve pushes on the locking bushing, and may overcome the force keeping the contacts together and pushing the ITA and receiver apart. The shoulder on front of the sleeve contacts the receiver-facing side of the locking bushing in the ITA and begins separating the ITA and receiver sides, disengaging the contacts.

When the handle reaches a 90° forward position, as shown in FIG. 19, perpendicular to the base plate, the sleeve may be held back by the front inner face of the body so the leaflets can no longer slide over the head of the plunger, freeing the leaflets to bend inwards and slide out of the locking bushing. The sleeve may be held in place by the ball plunger again and the inside face of the body prevents it from continuing forward. The spring plunger presses the plunger all the way forward to keep the mechanism unlocked so the ITA side may be removed from the receiver.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An engaging device of a Mass-Interconnect, the engaging device comprising:
   an interchangeable test adapter (ITA); and
   a locking mechanism, comprising:
      a plunger comprising a plunger head at a first end thereof;
      a leaflet insert disposed over the plunger;
      a sleeve disposed over the leaflet insert;
      an over-dead-center (ODC) link connected to the plunger at a second end thereof opposite to the first end; and
      a rotatable handle connected to the ODC link,
   wherein the plunger, the leaflet insert, and the sleeve of the locking mechanism engage or disengage the ITA when a user rotates the rotatable handle.

2. The engaging device of claim 1, further comprising leaflets connected to the leaflet insert, wherein the plunger head fills a space between the leaflets to prevent the leaflets from slipping out of a locking bushing of the ITA when the locking mechanism is engaged and locked with the ITA.

3. The engaging device of claim 2, wherein the ODC link, the rotatable handle, and the sleeve bear substantially all of the force required to engage or disengage the ITA.

4. The engaging device of claim 3, wherein locking tabs respectively disposed at ends of the leaflets transfer force from the plunger directly to the locking bushing when engaging the ITA.

5. The engaging device of claim 4, wherein the leaflets bear no significant longitudinal forces without simultaneous contact between the leaflets, the plunger head, and the locking bushing.

6. The engaging device of claim 2, wherein:
   the plunger further comprises a depression portion having a smaller diameter than a diameter of a remainder of the plunger; and
   the leaflets each comprise a thickened portion having a tapered, increasing thickness corresponding to an area where the leaflets extend over the depression portion of the plunger.

7. The engaging device of claim 6, wherein the thickened portion of the leaflets respectively protect the leaflets from bending when the plunger is engaged with the ITA.

8. A locking mechanism for engaging and disengaging an Interchangeable Tool Assembly (ITA), the locking mechanism comprising:
   a plunger having a plunger head positioned at a distal end thereof;
   a plurality of leaflets each having a locking tab at a tip thereof, the plurality of leaflets disposed over the plunger;
   wherein the locking tabs each have a 45° angled surface, and the plunger head has an inner surface having a complimentary 45° angle that fills a space between the locking tabs at the 45° angled surface thereof.

9. The locking mechanism of claim 8, wherein the plunger head smoothly transfers force from the plunger to a locking bushing of the ITA with minimal strain in the plurality of leaflets.

10. The locking mechanism of claim 9, wherein the locking mechanism further comprises:
   a leaflet insert disposed over the plunger, the plurality of leaflets connected to the leaflet insert;
   a sleeve disposed over the leaflet insert;
   an over-dead-center (ODC) link connected to the plunger at a second distal thereof opposite to the distal end of the plunger; and
   a rotatable handle connected to the ODC link,
   wherein the plunger, the plurality of leaflets, the leaflet insert, and the sleeve of the locking mechanism engage or disengage the ITA when a user rotates the rotatable handle.

11. A method of engaging an engaging device, the engaging device comprising:
   an interchangeable test adapter (ITA) comprising a locking bushing; and
   a locking mechanism comprising:
      a plunger comprising a plunger head at a first end thereof,
      a leaflet insert comprising locking tabs, the leaflet insert disposed over the plunger,
      a sleeve disposed over the leaflet insert,
      an over-dead-center (ODC) link connected to the plunger at a second end thereof opposite to the first end, and
      a handle connected to the ODC link,
   the method comprising rotating the handle 90° by a user from an unlocked position to a locked ODC position, wherein the locking mechanism is locked with the ITA during a full 90° rotation of the handle.

12. The method of claim 11, wherein:

in a first engaging step the handle starts in a vertical (90°) docking position and the locking mechanism is in an unlocked position;

the user slides the ITA and locking mechanism together such that the locking tabs are compressed into place inside the locking bushing; and a space is formed between the leaflets and the plunger head in the locking mechanism, whereby the locking mechanism is freely inserted into the locking bushing by the user.

13. The method of claim 12, wherein:

in a second engaging step, the handle is rotated from 87° to 85° by the user; and the plunger head is disposed between the leaflets thereby holding them open, and the locking tabs do not contact the locking bushing.

14. The method of claim 13, wherein:

in a third engaging step, the handle is rotated from 85° to 76° by the user;

the ODC link pushes the plunger into a locked position, thereby keeping the leaflets from compressing inward; and the locking tabs contact the locking bushing, and the plunger head pulls on the locking bushing and the locking tabs, thereby pulling the ITA and locking mechanism together.

15. The method of claim 14, wherein:

the handle is rotated from 85° to 76° by the user;

the plunger travels into the locked ODC position, and the ODC link is in an over-dead-center position; and the plunger pulls the ITA and locking mechanism together for full engagement thereof.

16. The method of claim 15, wherein:

in the locked ODC position the plunger head fully fills the space between the leaflets, preventing them from bending inwards; and in the locked ODC position the ITA and locking mechanism continue to have full engagement until the ITA and locking mechanism are disengaged by the user.

* * * * *